(12) United States Patent
Jeon et al.

(10) Patent No.: US 11,309,457 B2
(45) Date of Patent: Apr. 19, 2022

(54) SEMICONDUCTOR LIGHT-EMITTING ELEMENT

(71) Applicant: SEMICON LIGHT CO., LTD., Gyeonggi-do (KR)

(72) Inventors: Soo Kun Jeon, Gyeonggi-do (KR); Geun Mo Jin, Gyeonggi-do (KR); Jun Chun Park, Gyeonggi-do (KR); Yeon Ho Jeong, Gyeonggi-do (KR); Il Gyun Choi, Gyeonggi-do (KR)

(73) Assignee: SEMICON LIGHT CO., LTD., Gyeonggi-do (KR)

( * ) Notice: Subject to any disclaimer, the term of this patent is extended or adjusted under 35 U.S.C. 154(b) by 465 days.

(21) Appl. No.: 16/068,081

(22) PCT Filed: Jan. 5, 2017

(86) PCT No.: PCT/KR2017/000152
§ 371 (c)(1),
(2) Date: Jul. 3, 2018

(87) PCT Pub. No.: WO2017/119743
PCT Pub. Date: Jul. 13, 2017

(65) Prior Publication Data
US 2020/0287088 A1    Sep. 10, 2020

(30) Foreign Application Priority Data

Jan. 5, 2016 (KR) .................. 10-2016-0000945
Apr. 11, 2016 (KR) .................. 10-2016-0044124
(Continued)

(51) Int. Cl.
*H01L 33/38* (2010.01)
*H01L 27/15* (2006.01)
(Continued)

(52) U.S. Cl.
CPC .......... *H01L 33/382* (2013.01); *H01L 27/153* (2013.01); *H01L 33/0025* (2013.01);
(Continued)

(58) Field of Classification Search
CPC . H01L 33/382; H01L 33/0025; H01L 33/387; H01L 33/46
See application file for complete search history.

(56) References Cited

U.S. PATENT DOCUMENTS 8,120,047 B2    2/2012 Kim et al.
8,319,246 B2   11/2012 Sugizaki
(Continued)

FOREIGN PATENT DOCUMENTS

JP    2011-071274 A    4/2011
KR   10-2010-0016631 A    2/2010
(Continued)

*Primary Examiner* — Matthew L Reames
(74) *Attorney, Agent, or Firm* — Harness, Dickey & Pierce, P.L.C.

(57) ABSTRACT

Disclosed is a semiconductor light emitting device characterized by being a flip chip including: a plurality of semiconductor layers, which includes a first semiconductor layer having a first conductivity, a second semiconductor layer having a second conductivity different from the first conductivity type, and an active layer interpositioned between the first and second semiconductor layers and adapted to generate light by electron-hole recombination; an insulating layer, which is formed on the plurality of semiconductor layers and has openings; and an electrode formed on the insulating layer and electrically connected to the plurality of semiconductor layers through the opening, wherein the electrode has a top face and a bottom face, with the top face having a smaller area than the bottom face.

7 Claims, 24 Drawing Sheets

(30) Foreign Application Priority Data

Jun. 3, 2016 (KR) .................. 10-2016-0069562
Sep. 7, 2016 (KR) .................. 10-2016-0115017

(51) Int. Cl.

| | |
|---|---|
| *H01L 33/00* | (2010.01) |
| *H01L 33/06* | (2010.01) |
| *H01L 33/12* | (2010.01) |
| *H01L 33/32* | (2010.01) |
| *H01L 33/46* | (2010.01) |
| *H01L 33/62* | (2010.01) |

(52) U.S. Cl.

CPC .............. *H01L 33/06* (2013.01); *H01L 33/12* (2013.01); *H01L 33/325* (2013.01); *H01L 33/387* (2013.01); *H01L 33/46* (2013.01); *H01L 33/62* (2013.01); *H01L 2933/0016* (2013.01); *H01L 2933/0025* (2013.01)

(56) References Cited

U.S. PATENT DOCUMENTS

| | | | |
|---|---|---|---|
| 8,476,644 | B2 | 7/2013 | Illek et al. |
| 2012/0049219 | A1* | 3/2012 | Kamiya ............... H01L 33/46 257/98 |
| 2016/0149086 | A1* | 5/2016 | Sim ..................... H01L 33/62 257/98 |
| 2017/0098746 | A1* | 4/2017 | Bergmann ............ H01L 33/10 |

FOREIGN PATENT DOCUMENTS

| | | |
|---|---|---|
| KR | 10-2010-0034797 A | 4/2010 |
| KR | 10-2013-0128746 A | 11/2013 |
| KR | 10-2015-0142373 A | 12/2015 |
| WO | WO-2015053600 A1 | 4/2015 |
| WO | WO-20160068643 A1 | 5/2016 |

\* cited by examiner

SEMICONDUCTOR LIGHT-EMITTING ELEMENT

CROSS-REFERENCE TO RELATED APPLICATIONS

This application is a National Phase application of PCT Application No. PCT/KR2017/0001520 filed on Jan. 5, 2017 which claims priority to Korean Patent Application No. 10-2016-0115017 filed on Sep. 7, 2016, Korean Patent Application No. 10-2016-0069562 filed on Jun. 3, 2016, Korean Patent Application No. 10-2016-0044124 filed on Apr. 11, 2016, and Korean Patent Application No. 10-2016-0000945 filed on Jan. 5, 2016. The entire disclosures of the applications identified in this paragraph are incorporated herein by reference.

FIELD

The present disclosure relates generally to a semiconductor light emitting device, and more specifically to a semiconductor light emitting device having improved performance.

BACKGROUND

This section provides background information related to the present disclosure which is not necessarily prior art. Unless specified otherwise, it is appreciated that throughout the description, directional terms, such as upper side/lower side, over/below and so on are defined with respect to the directions seen in the accompanying drawings.

FIG. 1 is a view showing an exemplary embodiment of a semiconductor light emitting device in the prior art.

The semiconductor light emitting device includes a growth substrate 10 (e.g., a sapphire substrate), and layers deposited on the growth substrate 10 in order, such as a buffer layer 20, a first semiconductor layer 30 (e.g., an n-type GaN layer), an active layer 40 adapted to generate light by electron-hole recombination (e.g., INGaN/(In)GaN MQWs) and a second semiconductor layer 50 having a second conductivity different from the first conductivity (e.g., a p-type GaN layer). A light-transmitting conductive film 60 for current spreading is then formed on the second semiconductor layer, followed by an electrode 70 serving as a bonding pad formed on the light-transmitting conductive film, and an electrode 80 (e.g., a Cr/Ni/Au stacked metallic pad) serving as a bonding pad is formed on an etch-exposed portion of the first semiconductor layer 30. This particular type of the semiconductor light emitting chip as shown in FIG. 1 is called a lateral chip. Here, a side of the growth substrate 10 serves as a mounting face during external electrical connection.

FIG. 2 is a view showing another exemplary embodiment of a semiconductor light emitting device disclosed in U.S. Pat. No. 7,262,436. For convenience of description, different reference numerals are used for some parts.

The semiconductor light emitting device includes a growth substrate 10, and layers deposited on the substrate in order, such as a first semiconductor layer 30 having a first conductivity, an active layer 40 adapted to generate light by electron-hole recombination and a second semiconductor layer 50 having a second conductivity different from the first conductivity, which are deposited on the substrate in the order mentioned. Three-layered electrode films 90, 291 and 92 adapted to reflect light towards the growth substrate 10 are then formed on the second semiconductor layer, in which first electrode film 90 can be a reflective Ag film, second electrode film 291 can be a Ni diffusion barrier, and third electrode film 92 can be an Au bonding layer. Further, an electrode 80 serving as a bonding pad is formed on an etch-exposed portion of the first semiconductor layer 30. Here, a side of the electrode film 92 serves as a mounting face during external electrical connection. This particular type of the semiconductor light emitting device as shown in FIG. 2 is called a flip chip, which is configured to employ the electrode as a mounting face during external electrical connection and to reflect light from the active layer towards the growth substrate. In such a flip chip shown in FIG. 2, although the electrode 80 formed on the first semiconductor layer 30 is placed at a lower height level than the electrode films 90, 291 and 92 formed on the second semiconductor layer, as an alternative, it may be formed at the same height level as the electrode films. Here, height levels are given with respect to the growth substrate 10.

FIG. 3 is a view showing another exemplary embodiment of a semiconductor light emitting device disclosed in U.S. Pat. No. 8,008,683. For convenience of description, different reference numerals are used for some parts.

In the semiconductor light emitting device shown, a first semiconductor layer 30 having a first conductivity, an active layer 40 adapted to generate light by electron-hole recombination and a second semiconductor layer 50 having a second conductivity different from the first conductivity are formed in the order mentioned. The semiconductor light emitting device further includes an electrode 120 formed on the side after the growth substrate has been removed therefrom, a supporting substrate 100 adapted to support the semiconductor layers 30, 40 and 50 and supply current to the second semiconductor layer 50, and an electrode 110 formed on the supporting substrate 100. The electrode 120 is externally electrically connected by wire bonding. A side of the electrode 110 serves as a mounting face during external electrical connection. This particular type of the semiconductor light emitting device as shown in FIG. 3, where the electrodes 110, 120 are arranged above and below the active layer 40, respectively, is called a vertical chip.

FIG. 4 is a view showing another exemplary embodiment of a flip chip disclosed in Korean Granted Patent Publication No. 10-1405449. For convenience of description, different reference numerals are used for some parts.

The flip chip includes a growth substrate 10, and layers deposited on the growth substrate 10 in order, such as a buffer layer 20, a first semiconductor layer 30 having a first conductivity, an active layer 40 adapted to generate light by electron-hole recombination and a second semiconductor layer 50 having a second conductivity different from the first conductivity. Moreover, the flip chip further includes a non-conductive reflective layer 200 made of a non-conductive material that reflects light from the active layer and adapted to cover etch-exposed portions of the first and second semiconductor layers 30 and 50 as an insulating layer; a first electrode 210 formed on the non-conductive reflective layer 200, electrically being connected with the first semiconductor layer 30; and a second electrode 211 formed on the non-conductive reflective layer 200, electrically being connected with the second semiconductor layer 50.

FIG. 5 is a view showing an exemplary embodiment of the semiconductor light emitting device disclosed in JP Patent Application Laid-Open No. 2006-20913.

The semiconductor light emitting device includes a substrate 100, a buffer layer grown on the substrate 100, an n-type semiconductor layer 300 grown on the buffer layer 200, an active layer 400 grown on the n-type semiconductor layer 300, a p-type semiconductor layer 500 grown on the active layer 400, a light transmitting conductive film 600 with a current spreading function, which is formed on the p-type semiconductor layer 500, a p-side bonding pad 700 formed on the light transmitting conductive film 600, and an n-side bonding pad 800 formed on an etch-exposed portion of the n-type semiconductor layer 300. Further, a DBR (Distributed Bragg Reflector) 900 and a metal reflective film 904 are provided on the light transmitting conductive film 600. While this structure features reduced light absorption by the metal reflective film 904, a possible drawback thereof is that current spreading is not smooth, as compared with the structure with the electrodes 901, 902 and 903.

FIG. 6 is a view showing an exemplary embodiment of a semiconductor light emitting device disclosed in Korean Granted Patent Publication No. 10-1611480.

The semiconductor light emitting device includes a substrate 110, a plurality of semiconductor layers 130, 140 and 150, a buffer layer 120, a light absorption barrier 41, a current spreading conductive film 160, a non-conductive reflective film 191, a first electrode 175, a second electrode 185, a first electrical connection 173, a second electrical connection 183, a first lower electrode 171, and a second lower electrode 181.

In the case where the electrodes are formed on the non-conductive reflective film 191, as light attempts to travel out of the non-conductive reflective film 191 into a layer of air, the light cannot actually get into the layer of air but is reflected because the layer of air has a high refractive index. However, light that has reached the first electrode 175 and the second electrode 185 is partly reflected and partly absorbed, resulting in a lower efficiency of reflection than the layer of air. This made it necessary to reduce the size of the first and second electrodes 175 and 185 so as to have a broader contact area between the layer of air and the non-conductive reflective film 191.

FIG. 7 is a view showing an exemplary embodiment of a semiconductor light emitting device disclosed in Korean Patent Application Laid-Open No. 10-2011-0031099.

FIG. 7(a) is a top view of a light emitting device 201, FIG. 7(b) is a cross-sectional view taken along line A-A, and FIG. 7(c) is a cross-sectional view taken along line B-B. The light emitting device 201 has a transparent conductive layer 230 provided on a p-side contact layer 228, and a plurality of p electrodes 240 provided on a certain portion of the transparent conductive layer 230. Further, the light emitting device 201 has a plurality of n electrodes 242 provided on exposed portions of an n-side contact layer 222 through a plurality of vias that start from the p-side contact layer 228 up to at least the surface of the n-side contact layer 222, lower insulating layers 250 provided to the inner faces of the vias and on the transparent conductive layer 230, and reflective layers 260 within the lower insulating layers 250. The reflective layers 260 are provided to in all portions except the top portions of the p electrode 240 and n electrode 242. The lower insulating layers 250 in contact with the transparent conductive layer 230 has vias 250a extending vertically from the p electrodes 240, respectively, and vias 250b extending vertically from the n electrodes 242, respectively. Moreover, a p wire 270 and an n wire 272 are provided onto the lower insulating layers 250 within the light emitting device 201. The p wire 270 has a second planar conductive part 2700 extending in the planar direction on the lower insulating layer 250, and a plurality of second vertical conductive parts 2702 electrically connected to the p electrodes 240, respectively, through the vias 250a.

The n wire 272 has a first planar conductive part 2720 extending in the planar direction on the lower insulating layer 250, and a plurality of first vertical conductive parts 2722 electrically connected to the n electrodes 242, respectively, through the vias formed in the semiconductor stack structure. In addition to the p wire 270 and the n wire 272, the light emitting device 201 further includes an upper insulating layer 280 provided on the lower insulating layer 250 in contact with the transparent conductive layer 230, a p-side bonding electrode 290 electrically connected to the p wire 270 through a p-side opening 280a formed in the upper insulating layer 280, and an n-side bonding electrode 292 electrically connected to the n wire 272 through an n-side opening 280b formed in the upper insulating layer 280.

Part of the light emitted from the light emitting layer 225 can be directed towards the p-side clad layer 226. This light directed towards the p-side clad layer 226 collides with the n wire 272 and p wire 270, and then it is partly reflected and partly absorbed. To prevent the absorption of the emitted light as much as possible, therefore, the n wire 272 and the p wire 270 are made to have a reduced width.

FIG. 8 is a view illustrating a problem that can possibly occur in flip chips.

In general, a flip chip C is electrically connected to an external substrate 400 (e.g., a PCB, a sub-mount, etc.) by soldering, and this soldering process is performed at a high temperature. When the flip chip C and the external substrate 400 are electrically connected by soldering, first and second electrodes 210 and 211 experience thermal shock, and thus, those edge regions 220 indicated by dotted lines in the first and second electrodes 210 and 211 are primarily under stress, creating a crack 230 in the insulating layer 200 between the first electrode 210 and the second electrode 211. The external substrate 400 includes external electrodes 410 and 420, and solder materials 420 and 421. The external electrode 410, 411 may be a conducting part provided on the sub-mount, a lead frame of the package, an electric pattern formed on the PCB, or the like. The shapes or forms of these external electrodes are not particularly limited, if they are conducting wires arranged independently of the flip chip C. For better understanding, the first electrode 210, the second electrode 211, and the insulating layer 200 in the structure of the flip chip C are illustrated on a larger scale. The other components follow the conventional structure of a flip chip. For example, they are substantially identical with those in FIG. 2, FIG. 4 and FIG. 5.

The present disclosure is provided to address the problems with conventional semiconductor light emitting devices by presenting a structure for semiconductor light emitting devices having improving performance.

DETAILED DESCRIPTION

Technical Purpose

Objects of the present invention will be described in 'Description of Specific Embodiments' section below.

Technical Means

This section provides a general summary of the disclosure and is not a comprehensive disclosure of its full scope or all of its features.

According to one aspect of the present disclosure, there is provided a semiconductor light emitting device characterized by being a flip chip including: a plurality of semiconductor layers, which includes a first semiconductor layer having a first conductivity, a second semiconductor layer having a second conductivity different from the first conductivity type, and an active layer interpositioned between the first and second semiconductor layers and adapted to generate light by electron-hole recombination; an insulating layer, which is formed on the plurality of semiconductor layers and has openings; and an electrode formed on the insulating layer and electrically connected to the plurality of semiconductor layers through the opening, wherein the electrode has a top face and a bottom face, with the top face having a smaller area than the bottom face.

According to another aspect of the present disclosure, there is provided a semiconductor light emitting device characterized by including: a plurality of semiconductor layers, which includes a first semiconductor layer having a first conductivity, a second semiconductor layer having a second conductivity different from the first conductivity type, and an active layer interpositioned between the first and second semiconductor layers and adapted to generate light by electron-hole recombination; a non-conductive reflective film formed on the plurality of semiconductor layers to reflect the light generated by the active layer towards the first semiconductor layer; an insulating layer formed on the non-conductive reflective film; a first electrode part, which is electrically connected to the first semiconductor layer and supplies either electrons or holes to the first semiconductor layer; and a second electrode part, which is electrically connected to the second semiconductor layer and supplies, to the second semiconductor layer, the other of the holes or the electrons, wherein the first and second electrode parts formed on the insulating layer each have an upper electrode, with the insulating layer being flat in a central region between the upper electrodes.

According to another aspect of the present disclosure, there is provided a semiconductor light emitting device characterized by including: a plurality of semiconductor layers, which includes a first semiconductor layer having a first conductivity, a second semiconductor layer having a second conductivity different from the first conductivity type, and an active layer interpositioned between the first and second semiconductor layers and adapted to generate light by electron-hole recombination; a non-conductive reflective film formed on the plurality of semiconductor layers to reflect the light generated by the active layer towards the first semiconductor layer; an insulating layer formed on the non-conductive reflective film; a first electrode part, which is electrically connected to the first semiconductor layer and supplies either electrons or holes to the first semiconductor layer; and a second electrode part, which is electrically connected to the second semiconductor layer and supplies, to the second semiconductor layer, the other of the holes or the electrons, wherein at least one of the first and second electrode parts includes a connection electrode formed between the non-conductive reflective film and the insulating layer, with the connection electrode covering over the non-conductive reflective film by at least 50% thereof.

According to another aspect of the present disclosure, there is provided a semiconductor light emitting device including: a plurality of semiconductor layers, which includes a first semiconductor layer having a first conductivity, a second semiconductor layer having a second conductivity different from the first conductivity type, and an active layer interpositioned between the first and second semiconductor layers and adapted to generate light by electron-hole recombination; a non-conductive reflective film formed on the plurality of semiconductor layers to reflect the light generated by the active layer towards the first semiconductor layer; an insulating layer formed on the non-conductive reflective film; a first electrode part, which is electrically connected to the first semiconductor layer and supplies either electrons or holes to the first semiconductor layer; and a second electrode part, which is electrically connected to the second semiconductor layer and supplies, to the second semiconductor layer, the other of the holes or the electrons, wherein the first electrode part includes a first pad electrode provided on top of the insulating layer, a first connection electrode formed between the non-conductive reflective film and the insulating layer, and a first lower electrode connected to the first semiconductor layer, a first lower electrical connection connecting the first lower electrode and the first connection electrode; and the second electrode part includes a second pad electrode provided on top of the insulating layer, a second connection electrode formed between the non-conductive reflective film and the insulating layer, a second lower electrode connected to the second semiconductor layer, and a second lower electrical connection connecting the second lower electrode and the second connection electrode, with the first pad electrode being at least one of those formed separately away from the second lower electrical connection and the second pad electrode being at least one of those formed separately away from the first lower electrical connection as seen in a plan view.

Technical Effect

Technical effects of the present invention will be described in 'Description of Specific Embodiments' section below.

DESCRIPTION OF SPECIFIC EMBODIMENTS

The present disclosure will now be described in detail with reference to the accompanying drawing(s).

Figure 9A:
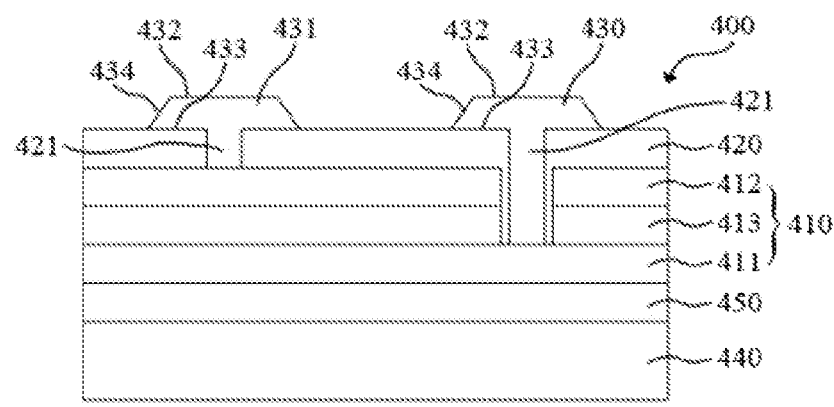
FIGS. 9(a), 9(b) and 9(c) are views showing an exemplary embodiment of a semiconductor light emitting device in accordance with the present disclosure.

FIG. 9 is a view showing an exemplary embodiment of a semiconductor light emitting device in accordance with the present disclosure.

The semiconductor light emitting device 400 includes a plurality of semiconductor layers 410 including a first semiconductor layer 411 having a first conductivity, a second a second semiconductor layer 412 having a second conductivity different from the first conductivity, and an active layer 413 interposed between the first and second semiconductor layers and adapted to generate light by electron-hole recombination; an insulating layer 420 having openings 421, and first and second electrodes 430 and 431 formed on the insulating layer 420 and electrically connected to the plurality of semiconductor layer 410 via the openings 421.

Figure 1:
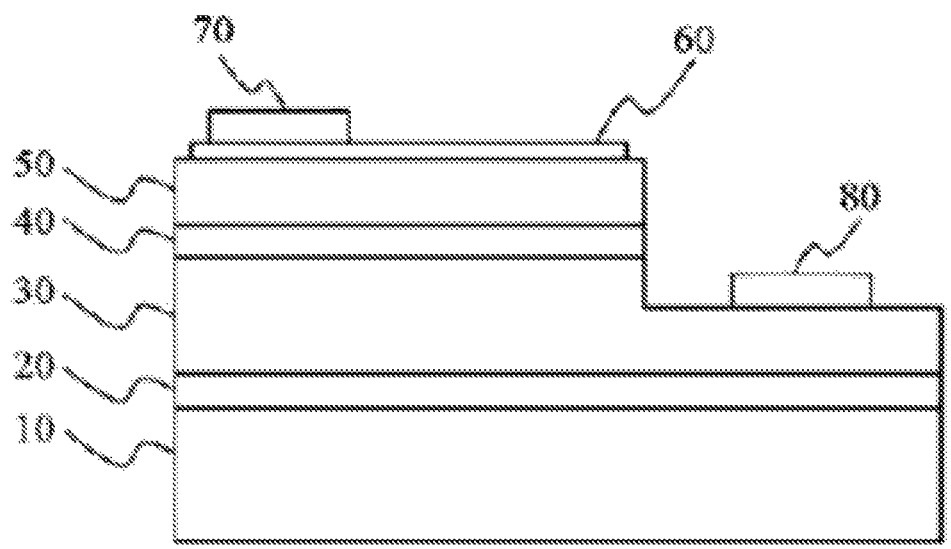
FIG. 1 is a view showing an exemplary embodiment of a semiconductor light emitting device in the prior art.
Figure 2:
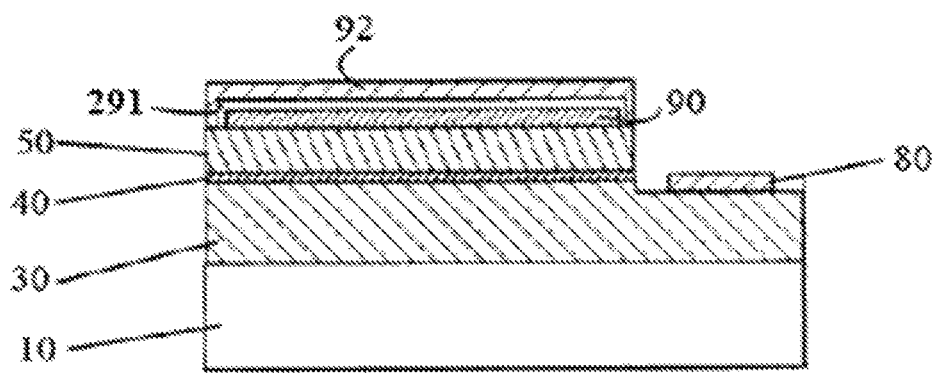
FIG. 2 is a view showing another exemplary embodiment of a semiconductor light emitting device chip disclosed in U.S. Pat. No. 7,262,436.
Figure 3:
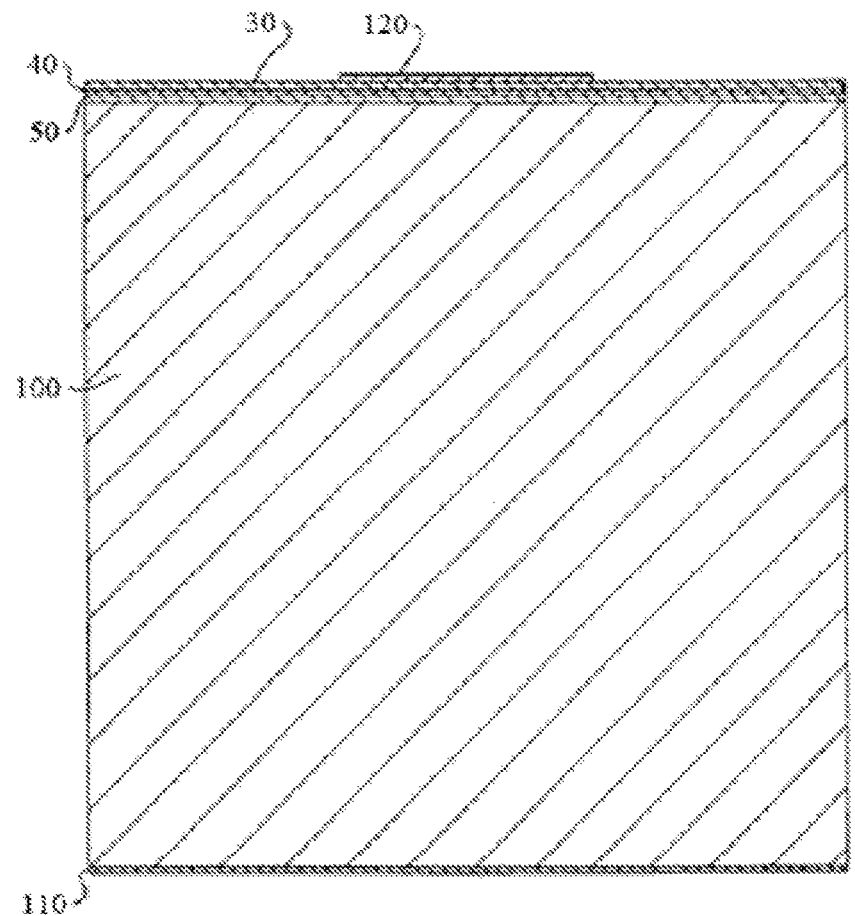
FIG. 3 is a view showing another exemplary embodiment of a semiconductor light emitting device chip disclosed in U.S. Pat. No. 8,008,683.
Figure 4:
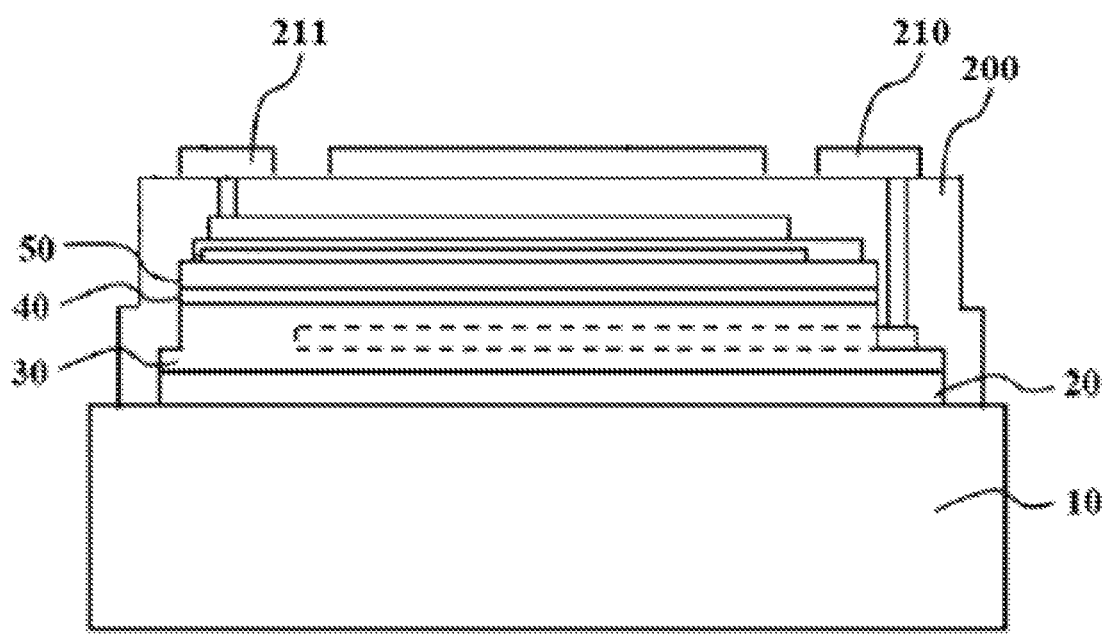
FIG. 4 is a view showing another exemplary embodiment of a flip chip disclosed in Korean Granted Patent Publication No. 10-1405449.
Figure 5:
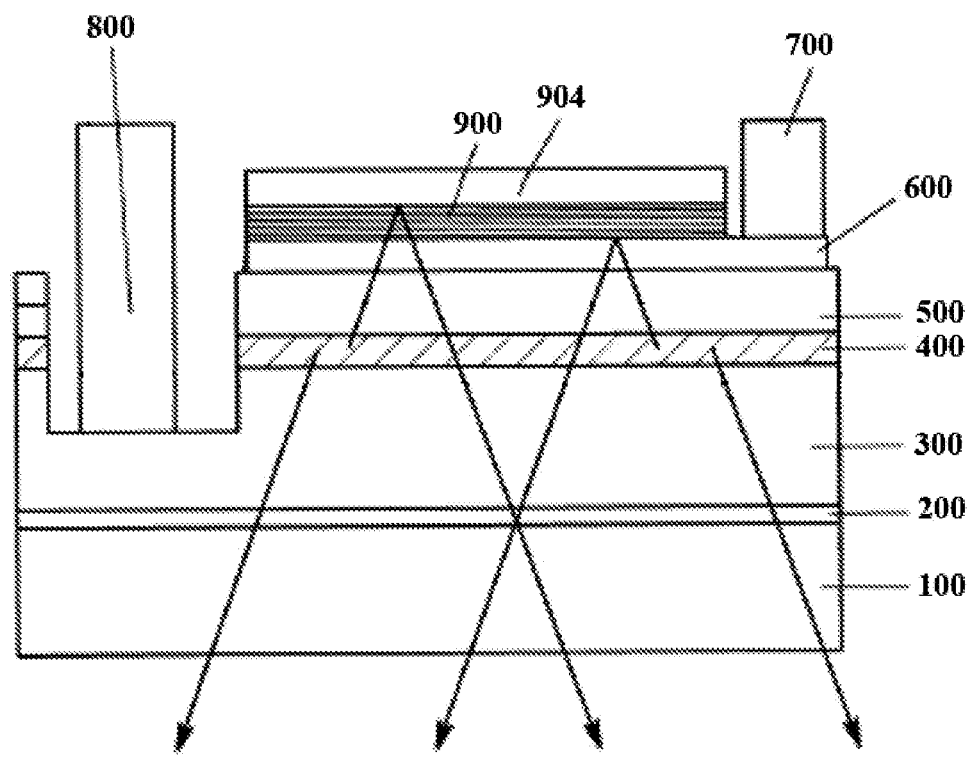
FIG. 5 is a view showing an exemplary embodiment of the semiconductor light emitting device disclosed in JP Patent Application Laid-Open No. 2006-20913.
Figure 6:
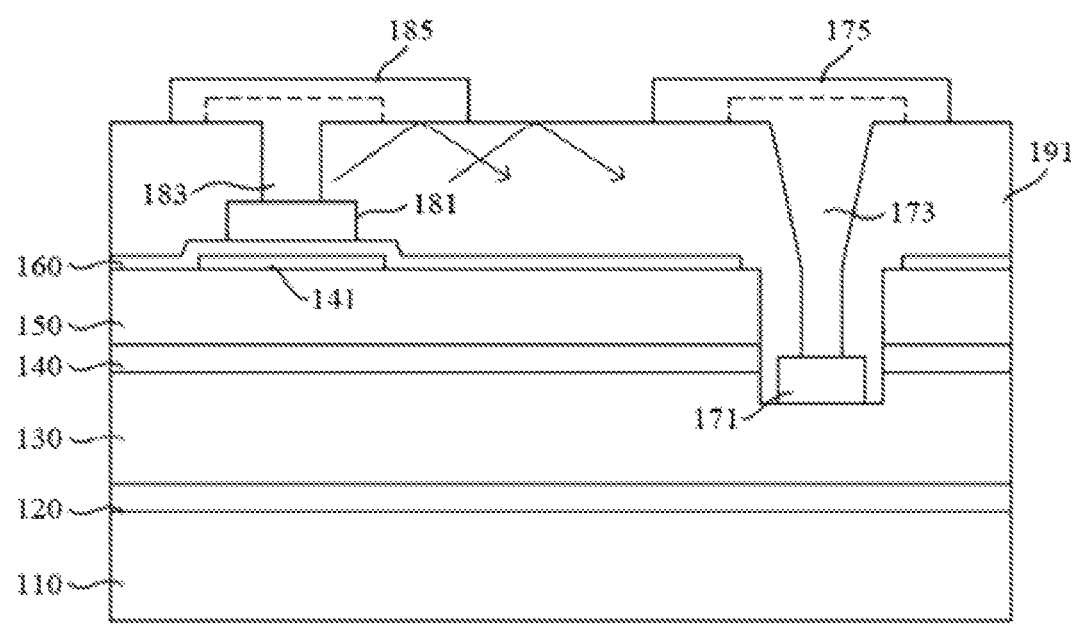
FIG. 6 is a view showing an exemplary embodiment of a semiconductor light emitting device disclosed in Korean Granted Patent Publication No. 10-1611480.
Figure 7A:
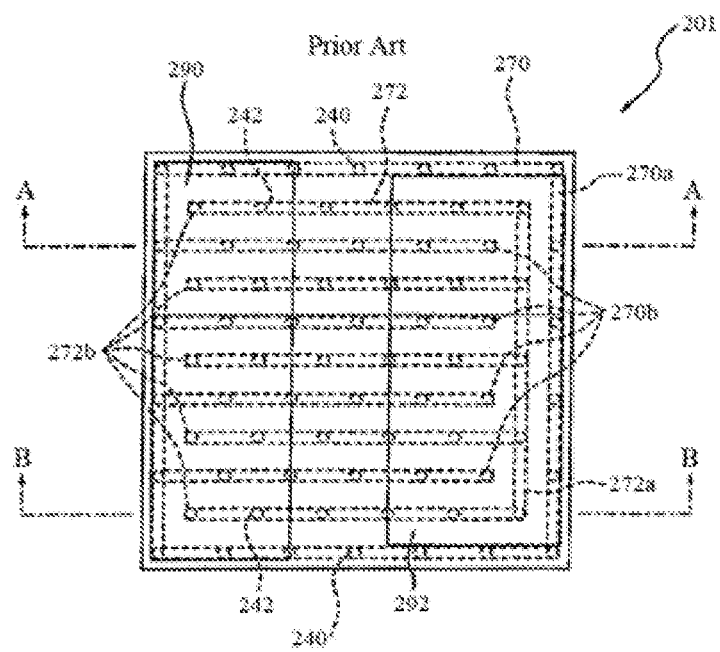
FIGS. 7(a), 7(b) and 7(c) are views showing an exemplary embodiment of a semiconductor light emitting device disclosed in Korean Patent Application Laid-Open No. 10-2011-0031099.
Figure 7B:
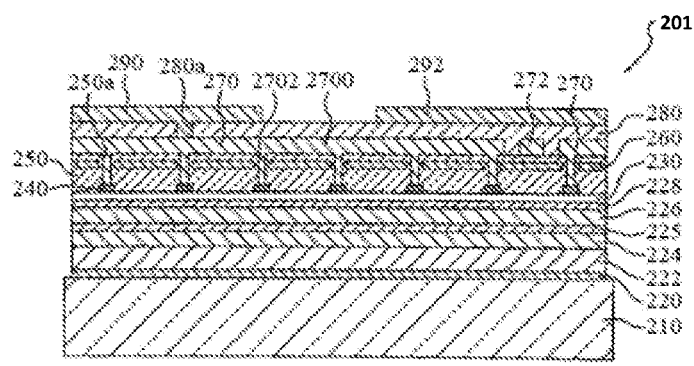
Figure 7C:
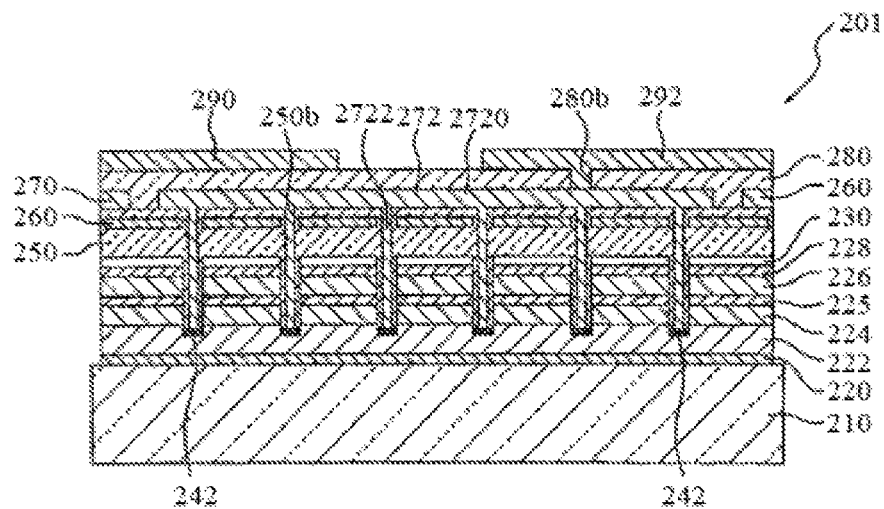
Figure 8:
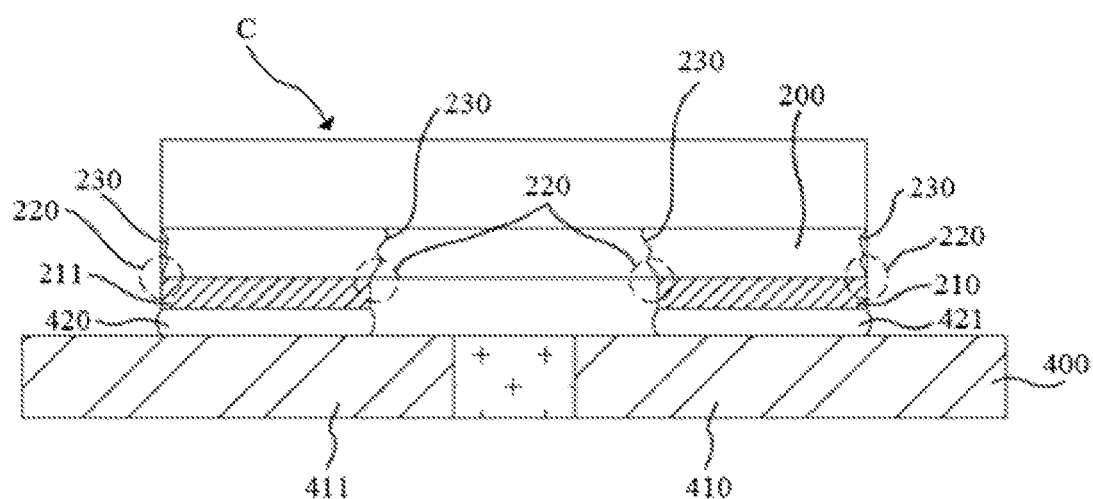
FIG. 8 illustrating a problem that can possibly occur in flip chips.
Figure 9B:
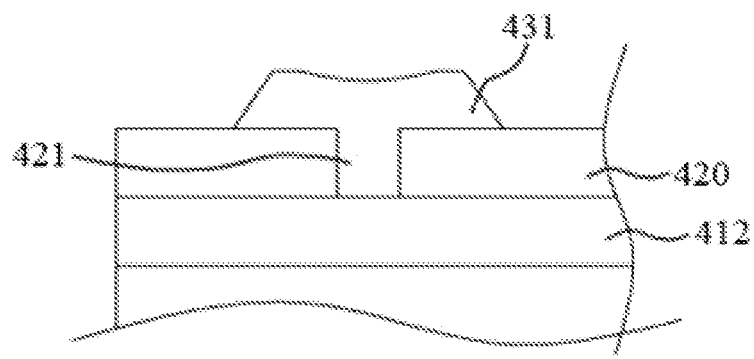
Figure 9C:
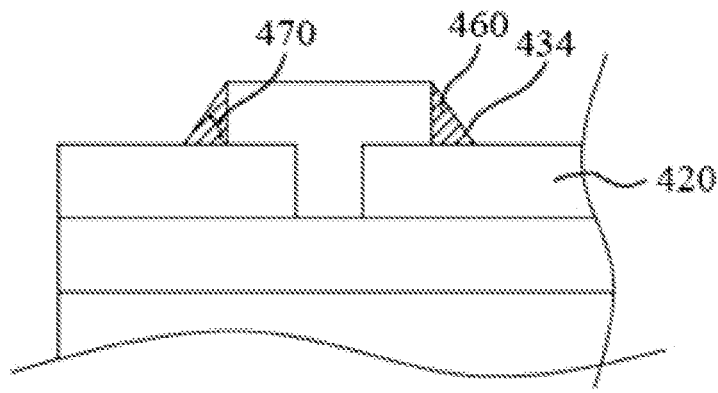

The plurality of semiconductor layers 410 is grown on a growth substrate 440. Additional layers including a buffer layer 450 may be present between the plurality of semiconductor layers 410 and the growth substrate 440. The insulating layer 420 is substantially the same as the insulating layer 200 or the upper insulating layer 280 described in FIG. 4 and FIG. 7. For example, the insulating layer 420 may be a non-conductive reflective layer 420 made of a non-conductive material (e.g. a Distributed Bragg Reflector, a stack of alternating $TiO_2$ and $SiO_2$ pairs) that reflects light generated by the active layer towards the plurality of semiconductor layers 410. Alternatively, it may be the insulating layer 420 including a conductive reflective layer, or the insulating layer 420 having an electrical insulation function only. Meanwhile, if the semiconductor light emitting device 400 is a flip chip, it is desirable that the insulating layer 420 should be able to reflect the light generated by the active layer towards the plurality of semiconductor layers 410. Further, the insulating layer 420 has openings 421. The number of openings 421 may be determined as needed. The first electrode 430 and the second electrode 431 are electrically connected to the plurality of semiconductor layers 410 through the openings 421. As shown in FIG. 9, the first electrode 430 is electrically connected to the first semiconductor layer 411, and the second electrode 431 is electrically connected to the second semiconductor layer 412. The second electrode 431 may be directly formed across and within the opening 421 and electrically connected to the second semiconductor layer 412 as shown in FIG. 9(b). While FIG. 9(b) illustrated the second electrode 431 only, the first electrode 430 may similarly be formed across and within the opening 421 and electrically connected to the first semiconductor layer 411. When the first electrode 430 and the second electrode 431 have a multilayered structure like the electrode films 90, 91 and 92 shown in FIG. 2, the top layer is usually Au, and preferably a Sn-containing soldering layer in order to increase bonding strength with an external substrate during soldering. The first electrode 430 and the second electrode 431 each have a top face 432 and a bottom face 433, in which the top face 432 has a smaller area than the bottom face 433. A lateral face 434 is sloped since the top face 432 has a smaller area than the bottom face 433. For conventional flip chips, in the case of the sloped lateral face 434, unlike a vertical latera face, stress generated on the edges is distributed as illustrated in cross-hatched regions 460 in FIG. 9(c), and cracking of the insulating layer 420 can thus be prevented. Preferably, the lateral face 434 is sloped at an angle of inclination 470 of 70 degrees or less. As the structure of such a flip chip is already well known to people skilled in the art, it was briefly described here using its cross-sectional view only. For example, the exemplary embodiment shown in FIG. 4 corresponds to the structure of a flip chip.

Figure 10A:
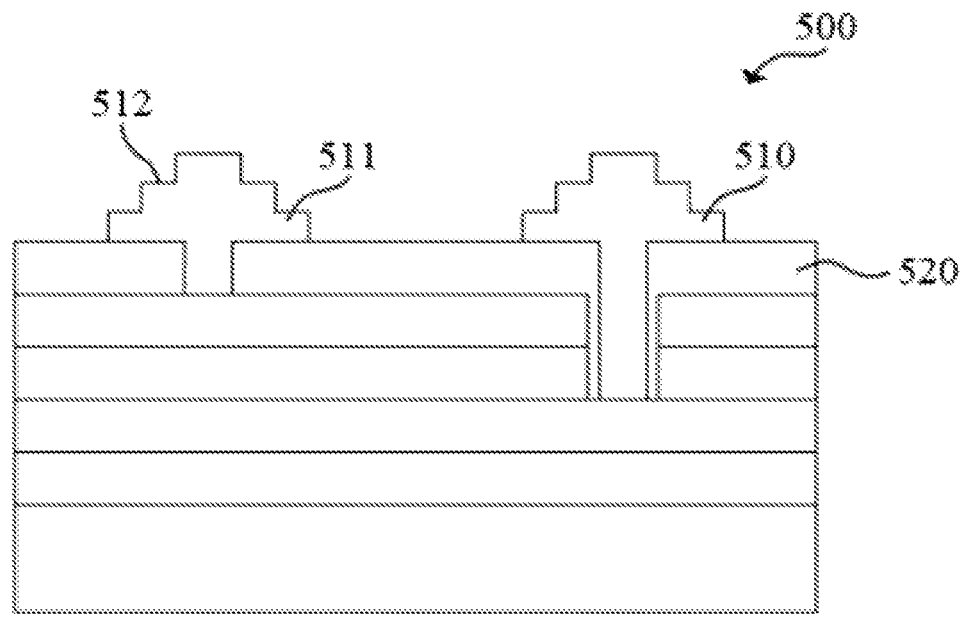
FIGS. 10(a) and 10(b) are views showing another exemplary embodiment of a semiconductor light emitting device in accordance with the present disclosure.

FIG. 10 is a view showing another exemplary embodiment of a semiconductor light emitting device in accordance with the present disclosure.

Figure 10B:
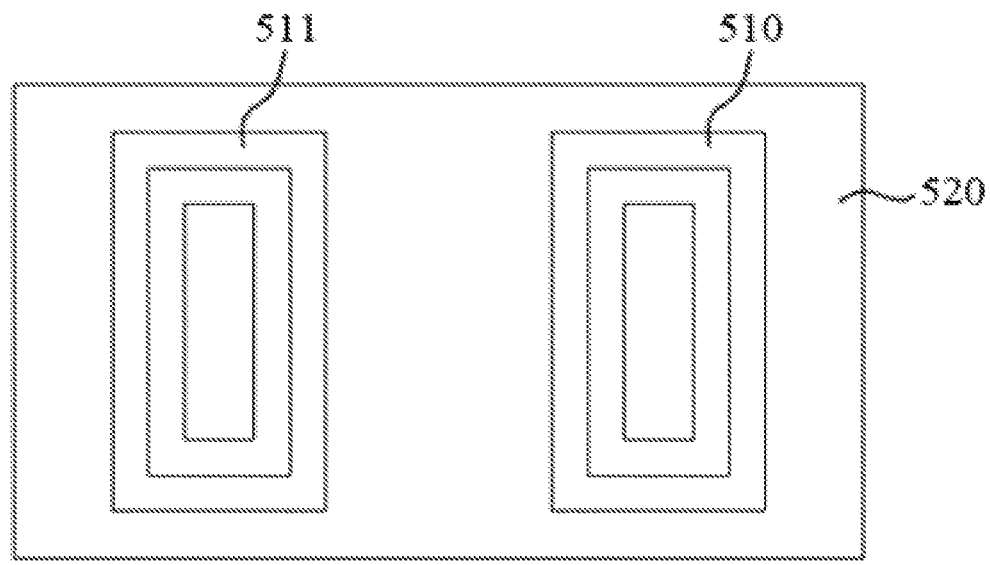

The semiconductor light emitting device 500 includes a first electrode 510 and a second electrode 511, each having stair-shaped lateral faces 512. The semiconductor light emitting device 500 is substantially the same as the semiconductor light emitting device 400 described in FIG. 9, except for the stair-shaped lateral faces 512 of the electrodes. FIG. 10(b) is a top view showing the first and second electrodes 510 and 520 in a stair shape arranged on the insulating layer 520. With these stair-shaped lateral faces 512, the same effects as those described in FIG. 9(c) may be obtained.

Figure 11:
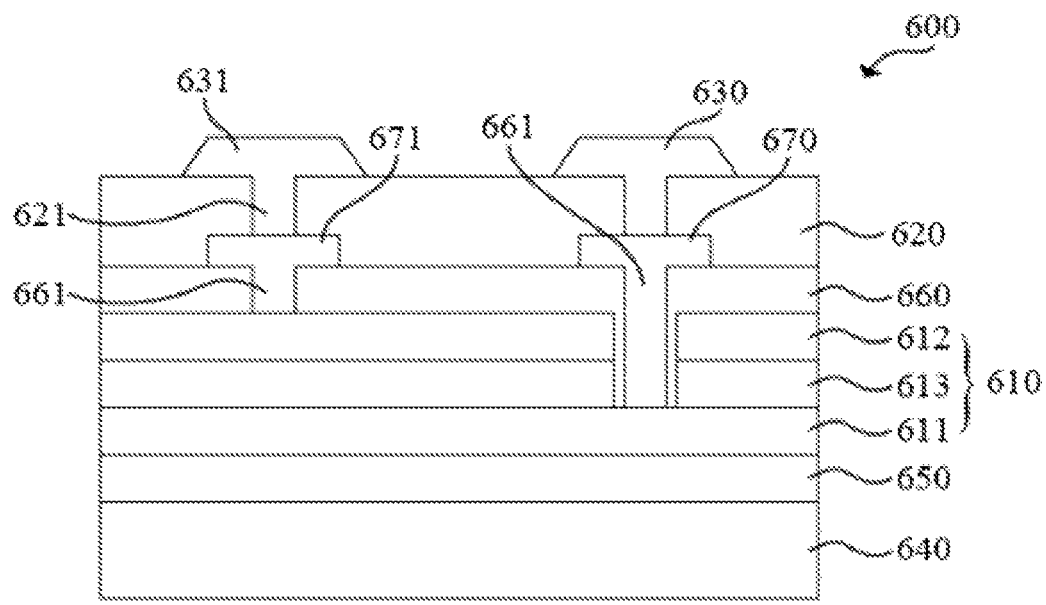
FIG. 11 is a view showing another exemplary embodiment of a semiconductor light emitting device in accordance with the present disclosure.

FIG. 11 is a view showing another exemplary embodiment of a semiconductor light emitting device in accordance with the present disclosure.

The semiconductor light emitting device 600 includes a plurality of semiconductor layers 610 including a first semiconductor layer 611 having a first conductivity, a second a second semiconductor layer 612 having a second conductivity different from the first conductivity, and an active layer 613 interposed between the first and second semiconductor layers and adapted to generate light by electron-hole recombination; a supplementary insulating layer 660, which is adapted to cover the second semiconductor layer 612 and has openings 661; first and second connection electrodes 670 and 671 formed over the supplementary insulating layer 660; an insulating layer 620 having openings 621 formed on the first and second connection electrodes 670 and 671; and first and second electrodes 630 and 631, which are formed on the insulating layer 620 and electrically connected to the first and second connection electrodes 670 and 671, respectively. The supplementary insulating layer 660 is substantially the same as the insulating layer 200 or the upper insulating layer 280 described in FIG. 4 or FIG. 7. For example, the supplementary insulating layer 660 may be a non-conductive reflective layer 660 made of a non-conductive material (e.g. a Distributed Bragg Reflector, a stack of alternating $TiO_2$ and $SiO_2$ pairs) that reflects light generated by the active layer towards the plurality of semiconductor layers 610. The number of the openings 661 provided in the supplementary insulating layer 660 may be determined as needed. As shown in FIG. 11, the first connection electrode 670 is electrically connected to the first semiconductor layer 611 through the opening 661 provided in the supplementary insulating layer 660, and the second connection electrode 671 is electrically connected to the second semiconductor layer 612 through the opening 661 provided in the supplementary insulating layer 660. Also, the first connection electrode 670 is electrically connected to the first electrode 630 through the opening 621 provided in the insulating layer 620, and the second connection electrode 671 is electrically connected to the second electrode 631 through the opening 621 provided in the insulating layer 620. The semiconductor light emitting device 600 is substantially the same as the semiconductor light emitting device 400 described in FIG. 9, excluding the features described FIG. 11. As the structure of such a flip chip including the first and second connection electrodes 670 and 671 are already well known to people skilled in the art, it was briefly described here using its cross-sectional view only. For example, the exemplary embodiment shown in FIG. 7 corresponds to the structure of a flip chip. In addition, while FIG. 9 through FIG. 11 illustrated the first electrode 430, 510, or 630 and the second electrode 431, 511, or 631 on the insulating layer 420, 520, or 620 having the top face larger than the bottom face, the first electrode 430, 510, or 630 and the second electrode 431, 511, or 631 may also have the top face smaller than the bottom face as an alternative within the scope of the present disclosure.

Figure 12:
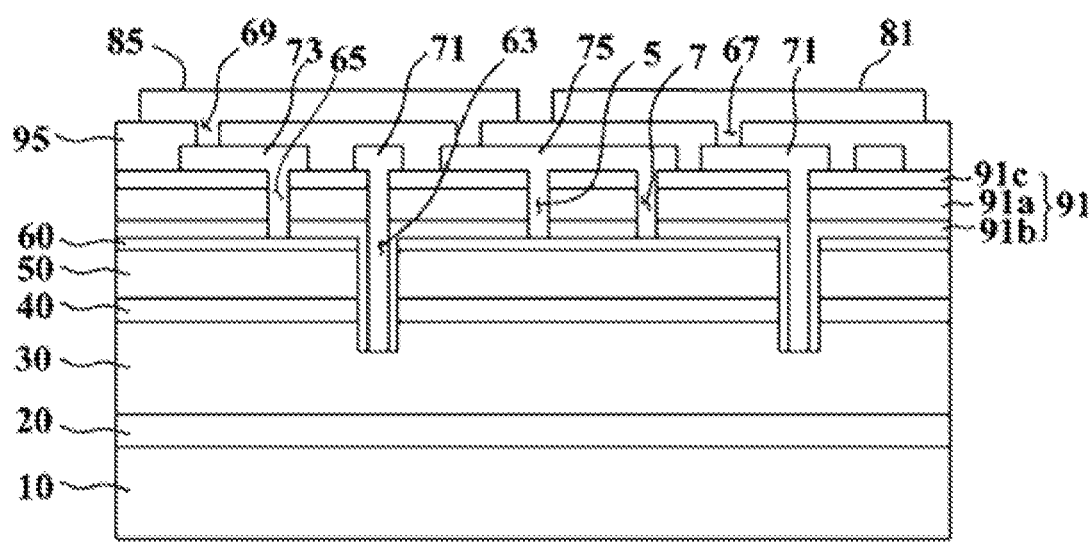
FIG. 12 is a view showing another exemplary embodiment of a semiconductor light emitting device in accordance with the present disclosure.

FIG. 12 is a view showing another exemplary embodiment of a semiconductor light emitting device in accordance with the present disclosure.

The semiconductor light emitting device includes a substrate 10, a plurality of semiconductor layers 30, 40 and 50, a reflective layer 91, first connection electrodes 71, a second connection electrode 75, a first electrode 81, and a second electrode 85. FIG. 12 illustrates a cross-sectional view taken along line A-A in FIG. 17. The following will now describe a Group III-nitride semiconductor light emitting device as an example.

The substrate 10 is typically made of sapphire, SiC, Si, GaN or the like, and it will eventually be removed.

On a buffer layer 20 formed on the substrate 10, there is provided the plurality of semiconductor layers, i.e. a first semiconductor layer 30 (e.g. Si-doped GaN) having a first conductivity type, a second semiconductor layer 50 (e.g. Mg-doped GaN) having a second conductivity type different from the first conductivity type, and an active layer 40 (e.g. InGaN/(In)/GaN multiple quantum well structure) which is interposed between the first semiconductor layer 30 and the second semiconductor layer 50 and generates light by electron-hole recombination. Each of the plurality of semiconductor layers 30, 40, 50 may have a multilayered structure, and the buffer layer 20 may optionally be omitted.

The reflective layer 91 reflects light from the active light 40 towards the plurality of semiconductor layers 30, 40 and 50. In this exemplary embodiment, the reflective layer 91 is formed of a non-conductive reflective film for reducing light absorption by a metal reflective film. The reflective layer 91 includes a DBR 91a, a dielectric film 91b, and a clad film 91c. The dielectric film 91b or the clad film 91c may be omitted. If the DBR 91a is non-conductive, the dielectric film 91b, the DBR 91a and the clad film 91c all serve as the non-conductive reflective film 91.

The DBR 91a reflect light from the active layer 40 towards the substrate 10. The DBR 91a is preferably made of a light-transmitting material (e.g. $SiO_2/TiO_2$) to prevent absorption of the light.

The dielectric film 91b is placed between the plurality of semiconductor layers 30, 40 and 50 and the DBR 91a, and has a lower effective refractive index than the DBR 91a. Here, the effective refractive index means an equivalent refractive index of light that can travel in a waveguide made of materials having different refractive indices. The dielectric film 91b may assist reflection of the light, and serve as an insulating film for electrically shielding the first connection electrodes 71 from the second semiconductor layer 50 and the active layer 40.

The clad layer 91c is formed on the DBR 91a, and it may also be made of a material having a lower effective refractive index than the DBR 91a (e.g. $Al_2O_3$, $SiO_2$, SiON, MgF, CaF).

A large portion of the light generated in the active layer 40 is reflected towards the first semiconductor layer 30 by the dielectric film 91b and the DBR 91a. The relationships among the dielectric film 91b, the DBR 91a and the clad layer 91c can be explained from the perspective of an optical waveguide. The optical waveguide is a structure that encloses the propagation part of light by a material having a lower refractive index than the refractive index of the light propagation part and guides the light using total internal reflection. In this regard, if the DBR 91a is taken as the propagation part, the dielectric film 91b and the clad film 91c can be considered as part of the waveguide, enclosing the propagation part.

The reflective layer 91 has at least one first opening 63, a plurality of second openings 5 and 7 and a plurality of third openings 65, which are used as electrical passages. In this exemplary embodiment, the first openings 63 are formed in the reflective layer 91, the second semiconductor layer 50, the active layer 40 and part of the first semiconductor layer 30, the plurality of second openings 5 and 7 are formed passing through the reflective layer 91, and the plurality of third openings 65 are formed close to the edges (see FIG. 17).

The plurality of second openings 5 and 7 include an internal opening and at least two peripheral openings 7 located around the internal opening. In this exemplary embodiment, the plurality of second openings 5 and 7 include an internal opening 5 and four peripheral openings 7. Here, the internal opening 5 and the peripheral openings 7 are passages for supplying holes. As seen from the top, the internal opening 5 is located approximately at a center portion of the semiconductor light emitting device, between the first electrode 81 and the second electrode 85. The internal opening 5 and the peripheral openings 7 will be described in more detail later.

Figure 17:
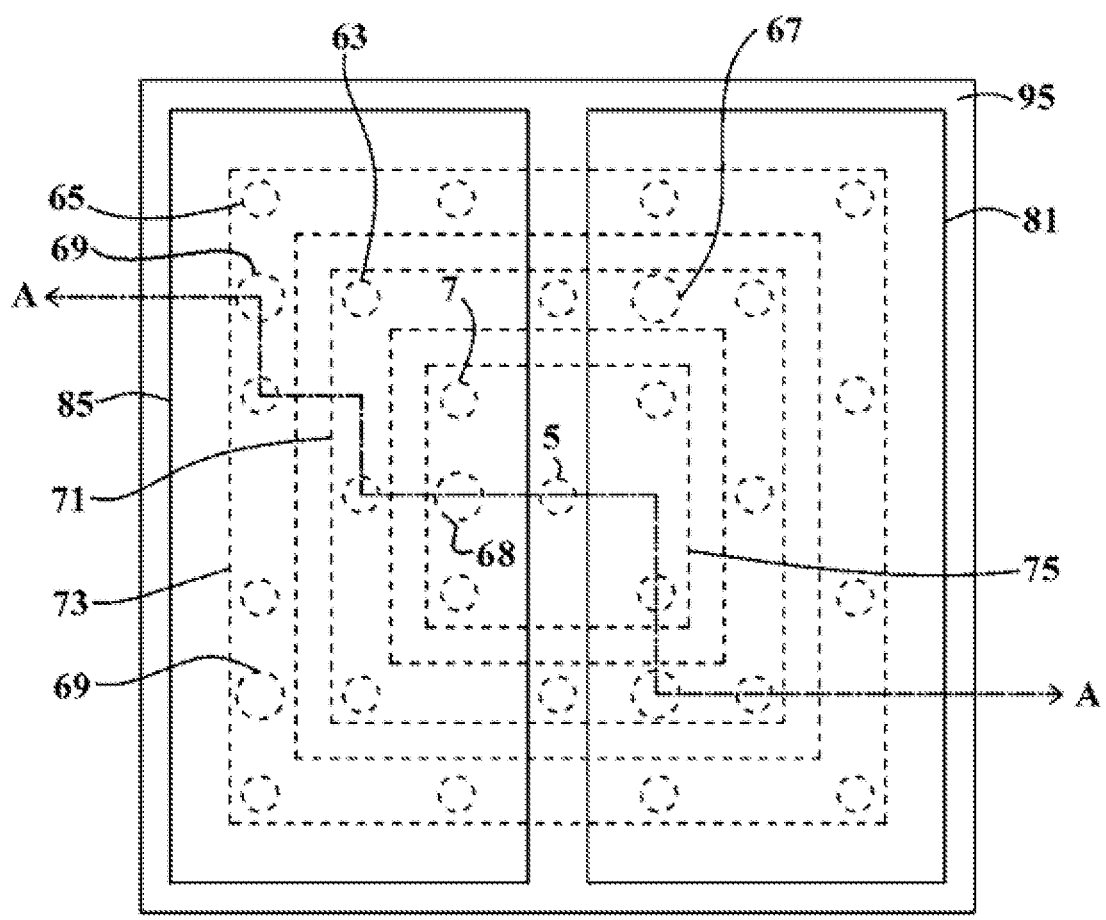

The first and second connection electrodes 71 and 75 are formed on the reflective layer 91, for example, on the clad film 91c. The first connection electrodes 71 are extended to the plurality of first openings 63 and electrically connected to the first semiconductor layer 30. The second connection electrode 75 is electrically connected to the second semiconductor layer 50 through the plurality of second openings 5 and 7. The internal opening 5 and the plurality of peripheral openings 7 are electrically connected by the second connection electrode 75. In this exemplary embodiment, the second connection electrode 75 has a quadangular plate shape, covering the internal opening 5 and the plurality of peripheral openings 7, as shown in FIG. 17.

The first connection electrode 71 is formed into a closed loop to surround the first and second connection electrodes 75. The semiconductor light emitting device includes a third connection electrode 73. The third connection electrode 73 supplies holes to the second semiconductor layer through the third openings 65. The third connection electrode 73 is located outside the second connection electrode 75 in a closed loop form, connecting the plurality of third openings 65 together.

The semiconductor light emitting device can include a conductive film 60 between the reflective layer 91 and the plurality of semiconductor layers 30, 40 and 50, for example, between the dielectric film 91b and the second semiconductor layer 50. The conductive film 60 may be formed of a current spreading electrode (ITO or the like), an ohmic metal layer (Cr, Ti or the like), a reflective metal layer (Al, Ag or the like), or a combination thereof. In order to reduce light absorption by the metal layer, the conductive film 60 is preferably made of a light-transmitting conductive material (e.g. ITO). The second connection electrode 75 and the third connection electrode 73 are extended to the plurality of second openings 5 and 7 and the plurality of third openings 65, respectively, and electrically connected to the conductive film 60. In this exemplary embodiment, the dielectric film 91b between the conductive film 60 and the DBR 91a is extended into the inner face of the first opening 63 such that it insulates the first connection electrode 71 from the second semiconductor layer 50, the active layer 40 and the second connection electrode 75. As an alternative, a separate insulating film may be provided between the dielectric film 91b and the conductive film 60.

The plurality of first openings 63, the plurality of second openings 5 and 7, and the plurality of third openings 65 described above are formed for supplying uniform current or spreading current to the plurality of semiconductor layers 30, 40 and 50. A local region where the internal opening 5 out of the plurality of second openings 5 and 7 is present shows an increased light emission, as compared with ones without the internal opening 5.

The number, spacing and layout of the first, second and third openings 63, 5, 7 and 65 may suitably be modified, according to the size of the semiconductor light emitting device, and for accomplishing current spreading, uniform current supply and homogeneous emission of light. Unlike the one shown in FIG. 17, more than one internal opening 5 may be formed. In this exemplary embodiment, the plurality of peripheral openings 7, the plurality of first openings 63 and the plurality of third openings 65 are arranged symmetrically around the internal opening 5.

As current is supplied through the plurality of first and second openings 63, 5 and 7, it is possible that current may be concentrated more in some of the first and second openings 63, 5 and 7 especially if the current is not uniform, and this can lead to deterioration at those locations having concentrated currents.

In the present disclosure, the first connection electrode 71 is formed into a closed loop shape to enclose the first and second connection electrodes 71 and 75, and the third connection electrode 73 is also formed into a closed loop shape to enclose the second connection electrode 75. Here, the closed loop shape here includes not only a fully closed loop shape but also a partly open loop shape (see FIG. 19).

The geometrically symmetry of the connection electrodes and openings supplying uniform current is very advantageous to improve the supply of uniform current and further a uniform current density on a light emitting face. In addition, with the closed loop shape conforming to the outer edge of the light emitting face of the semiconductor light emitting device, the uniform current distribution would be improved even more.

If the internal opening 5 and the plurality of peripheral openings 7 serve as passages of currents of different polarities, electrical connection to the internal opening 5 may become troublesome or another complicated design will have to be considered. Because of this, in this exemplary embodiment, the internal opening 5 as well as the plurality of peripheral openings 7 serve as passages of currents of identical polarity, i.e. hole supply passages. In terms of the supply of electrons, when all of the internal opening 5 and the plurality of peripheral openings 7 serve as hole supply passages, electron density over the plurality of semiconductor layers 30, 40 and 50 under the second connection electrode 75 is assumed to be lower than electron density over the plurality of semiconductor layers 30, 40 and 50 outside the second connection electrode 75. Contrary to such an assumption, however, the inventors found out that light emission was increased in the plurality of semiconductor layers 30, 40 and 50 under the second connection electrode 75 than those without the internal opening 5. This is supposedly because, in the plurality of semiconductor layers 30, 40 and 50 under the second connection electrode 75, the recombination rate of electrons and holes is increased as a relatively high-density of holes due to the internal opening 5 attracts more electrodes from a region having a relatively low-density of holes.

Therefore, a uniform current distribution can be obtained by symmetrically arranging the first, second and third connection electrodes 71, 75 and 73 as well as the plurality of first, second and third openings 63, 5, 7 and 65 in the form of a closed loop shape in regions outside the second connection electrode 75, and light emission can be maintained or increased by having the internal opening 5 inside the second connection electrode 75.

For a higher efficiency of light emission, an area of the second connection electrode 75 or a distance between the internal opening 5 and the peripheral opening 7 can suitably be determined. For instance, if the distance between the internal opening 5 and the peripheral opening 7 increases, the second connection electrode 75 will have a larger area, and more regions will have a relatively high-density of holes. On the other hand, if the area of the second connection electrode 75 increases, holes can be supplied to a broader area. In general, for the semiconductor light emitting device to maintain good light emission performance, it is preferable that a temperature difference between different locations on the light emitting face is kept small. With a larger area for the second connection electrode 75, the number of electrical connections to the second electrode 85 (to be described) may be increased, and heat protection through the second electrode 85 may become more effective. On the other hand, when the second connection electrode 75 has a larger area, more regions across the light emitting face will have a relatively high-density of holes, which is not advantageous in terms of uniformity. The area of the second connection electrode 75, or the distance between the internal opening 5 and the peripheral openings 7 and the number of openings may affect an amount of light emission as holes attract electrons. Therefore, in designing a semiconductor light emitting device, the area of the second connection electrode 75 or the distance between the internal opening 5 and the peripheral openings 7 and the number of openings can be determined, considering which feature has a high priority to have.

In this exemplary embodiment, the semiconductor light emitting device includes an insulating layer 95 for covering the first connection electrodes 71, the second connection electrode 75 and the third connection electrode 73 on the reflective layer 91. The insulating layer 95 has at least one fourth opening 67, at least one fifth opening 68, and at least one sixth opening 69. The insulating layer 95 may be made of $SiO_2$.

A first electrode 81 and a second electrode 85 are formed on the insulating layer 95.

The first electrode 81 is electrically connected to the first connection electrode 71 through the at least one fourth opening 67 to supply electrons to the first semiconductor layer 30. The second electrode 85 is electrically connected to the second connection electrode 75 through the fifth opening 68, and the second electrode 85 is electrically connected to the third connection electrode 73 through the sixth opening 69 to supply holes to the second semiconductor layer 50. The first electrode 81 and the second electrode 85 may be electrodes for eutectic bonding.

The semiconductor light emitting device reduces light absorption by using the non-conductive reflective film including a DBR 91a, instead of a metal reflective film. Moreover, the plurality of first openings 63, the plurality of second openings 5 and 7, and the plurality of third openings 65 formed in the semiconductor light emitting device facilitates current spreading to the plurality of semiconductor layers 30, 40 and 50. In the semiconductor light emitting device, current is more uniformly supplied to the first connection electrode 71 or third connection electrode 73 in a closed loop shape such that deterioration due to concentrated currents is prevented. Further, the internal opening 5 covered with the second connection electrode 75 on the innermost side enables the semiconductor light emitting device to maintain or increase light emission in the internal regions.

FIG. 13 through FIG. 17 are views describing methods for fabricating a semiconductor light emitting device in accordance with the present disclosure.

Figure 13:
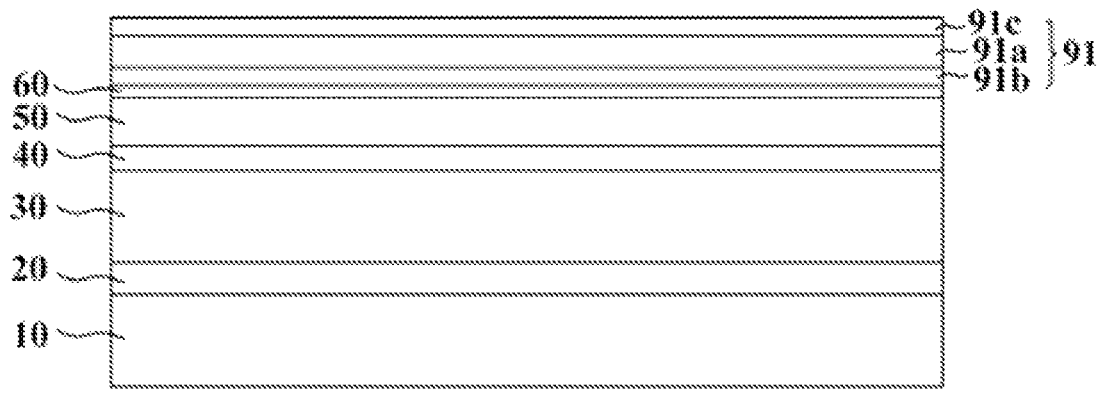
FIGS. 13, 14, 15, 16, and 17 are views describing methods for fabricating a semiconductor light emitting device in accordance with the present disclosure.

First, a plurality of semiconductor layers 30, 40 and 50 is grown on a substrate 10. As shown in FIG. 13, for example, a buffer layer (e.g. AlN or GaN buffer layer), an un-doped semiconductor layer (e.g. un-doped GaN), a first semiconductor layer 30 (e.g. Si-doped GaN) having a first conductivity, an active layer 40 adapted to generate light by electron-hole recombination (e.g. INGaN/(In)GaN MQWs), and a second semiconductor layer 50 having a second conductivity different from the first conductivity (e.g. Mg-doped GaN) are formed on the substrate 10 (e.g. $Al_2O_3$, Si, SiC).

The buffer layer may be omitted, and each of the plurality of semiconductor layers 30, 40 and 50 may have multiple layers. Although the first and second semiconductor layers 30 and 50 may have opposite conductivities, it is not desirable for a Group-III nitride semiconductor light emitting device.

Next, a conductive film 60 is formed on the second semiconductor layer 50. The conductive film 60 may be formed of a light-transmitting conductor (e.g., ITO) to reduce light absorption. The conductive film 60 may be omitted, but it is usually included for current spreading to the second semiconductor layer 50.

A reflective layer 91 is then formed on the conductive film 60. For example, a dielectric film 91b covering the conductive film 60, a DBR 91a, and a clad film 91c are formed. The dielectric film 91b or the clad film 91c may be omitted.

The DBR 91a may be composed of a stack of alternating $SiO_2$ and $TiO_2$ pairs. In an alternative, the DBR 91a may be a combination of a highly reflective material such as $Ta_2O_5$, HfO, ZrO or SiN, and a dielectric thin film (typically $SiO_2$) having a lower refractive index than the material. When the DBR 91a is made of $TiO_2/SiO_2$, it is preferably subjected to an optimum process designed in consideration of the reflectivity as a function of the incident angle and the wavelength, using the ¼ optical thickness of the wavelength of light coming out of the active light as a reference. It is not absolutely required for each layer to have a thickness corresponding to ¼ of the optical thickness of the wavelength. The number of combinations is suitably between 4 and 20 pairs.

For reflecting and guiding light, the DBR 91a preferably has an effective refractive index larger than a refractive index of the dielectric film 91b. When the DBR 91a is made of $SiO_2/TiO_2$, with $SiO_2$ having the refractive index of 1.46 and $TiO_2$ having the refractive index of 2.4, the effective refractive index of the DBR 91a has a value between 1.46 and 2.4. Therefore, the dielectric film 91b may be made of $SiO_2$, and it preferably has a thickness ranging from 0.2 µm to 1.0 µm. As the deposition of the DBR 91a needs to be done with high precision, the dielectric film 91b having a uniform thickness may be formed before the deposition such that the DBR 91b can be prepared in a stable manner, and light reflection can also benefit therefrom.

The clad film 91c can also be made of a metallic oxide such as $Al_2O_3$, or a dielectric film 91b such as $SiO_2$ or SiON, or a material such as MgF, CaF or the like. The clad film 91c may also be formed of $SiO_2$ having the refractive index of 1.46 that is smaller than the effective refractive index of the DBR 91a. Preferentially, the clad film 91c has a thickness which desirably ranges from $\lambda/4n$ to 3.0 µm, in which A denotes a wavelength of the light generated in the active layer 40, and n denotes a refractive index of a material of the clad film 91c. When $\lambda$ is 450 nm (4500 Å), the clad film 91c can be formed in a thickness of 771 Å (4500/4×1.46=771 Å) or more.

Considering that the top layer of the DBR 91a made of multiple pairs of $SiO_2$/$TiO_2$ can be composed of a $SiO_2$ layer having a thickness of λ/4n, it is desirable that the clad film 91c is thicker than λ/4n to be distinguished from the top layer of the DBR 91a that is underlaid the clad film 91c. However, it is not desirable for the top layer of the DBR 91a to be too thick (e.g., 3 μm or more) because this would impose a burden on the subsequent processes for forming a plurality of first semiconductor layer-side openings 63 and a plurality of second semiconductor layer-side openings 5 and 7 and only increase the material cost without contributing to the improvement of the efficiency. Therefore, an appropriate upper limit of the thickness of the clad film 91c would be between 1 μm and 3 μm, so as to relieve the burden on the subsequent processes for forming the plurality of first openings 63, the plurality of second openings 5 and 7, and a plurality of third openings. But still, it is not totally prohibited to make the top layer as thick as 3.0 μm or more.

When the DBR 91a comes into direct contact with the first, second and third connection electrodes 71, 75 and 73, part of the light travelling through the DBR 91a might be absorbed by the first, second and third connection electrodes 71, 75 and 73. As described above, by introducing the clad film 91c and the dielectric film 91b, each having a lower refractive index than the refractive index of the DBR 91a, it becomes possible to significantly reduce an amount of light being absorbed.

Optionally, the dielectric film 91b may be omitted. Also, although not desirable in terms of an optical waveguide, there is no reason to exclude the configuration composed of the DBR 91a and the clad film 91f, when the overall technical idea of this disclosure is taken into consideration. Alternatively, a $TiO_2$ dielectric film 91b may also be used in place of the DBR 91a. Further, as an alternative, the clad film 91f may be omitted if the DBR 91a includes a $SiO_2$ layer on the top thereof.

Accordingly, the dielectric film 91b, the DBR 91a and the clad film 91f form the non-conductive reflective film 91 and serve as an optical waveguide, and they preferentially have a combined thickness of 1 to 8 μm.

Figure 14:
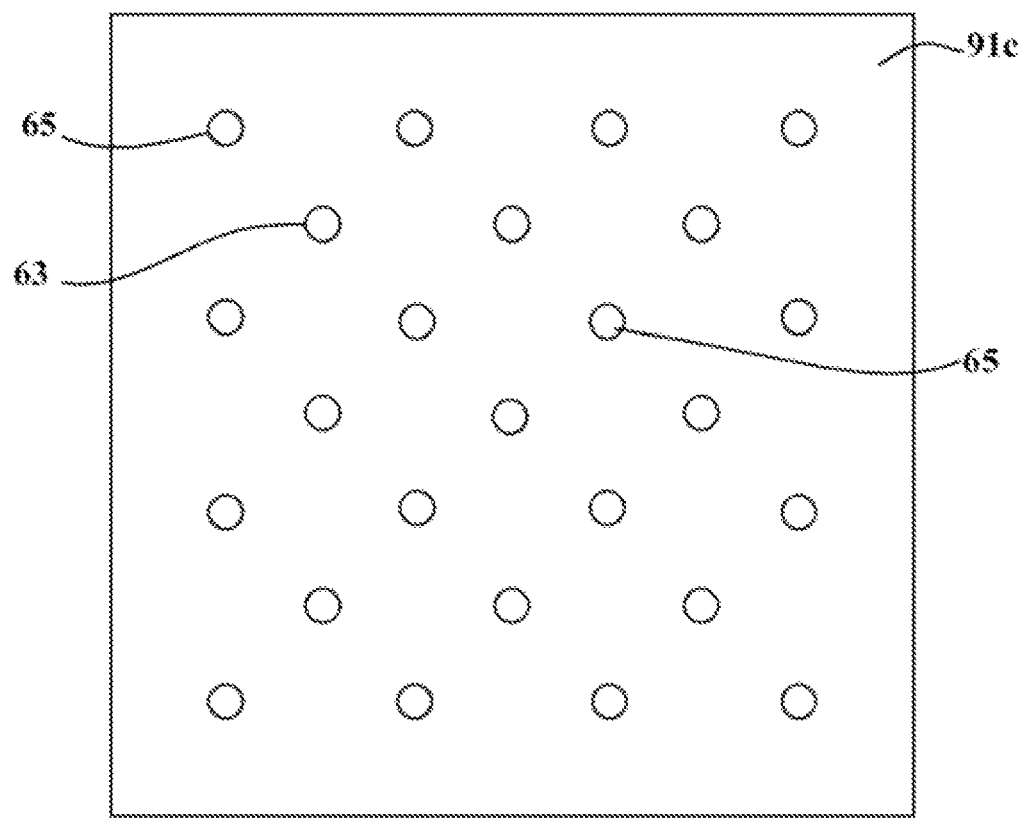
Figure 15:
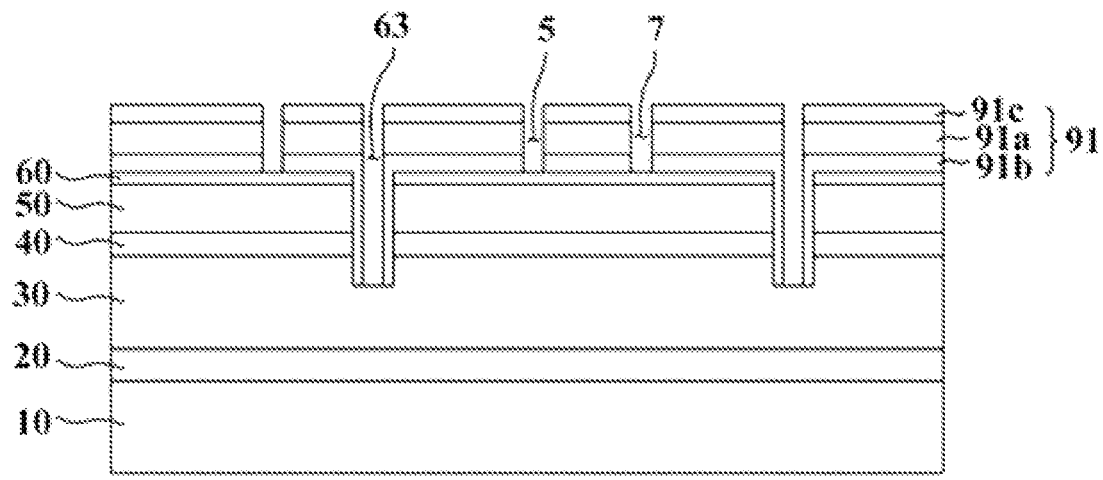

As shown in FIG. 14 and FIG. 15, a plurality of first openings 63, a plurality of second openings 5 and 7, and a plurality of third openings 65 are formed by dry etching, wet etching or a combination thereof. The first openings 63 are extended down to the reflective layer 91, the second semiconductor layer 50, the active layer 40 and part of the first semiconductor layer 30. The second openings 5 and 7 and the third openings 65 pass through the reflective layer 91 and expose part of the conductive film 60. The first, second and third openings 63, 5, 7 and 65 may be formed after the reflective layer 91. As an alternative, the first opening 63 may partly be formed in the plurality of semiconductor layers 30, 40 and 50 before or after the conductive film 60 is formed, and the reflective layer 91 is then formed such that it covers the first opening 63. The first opening 63 is further formed by an additional process which allows the first opening 63 to pass through the reflective layer 91, and the second and third openings 5, 7 and 65 may be formed at the same time during the additional process or by another, separate process.

Figure 16:
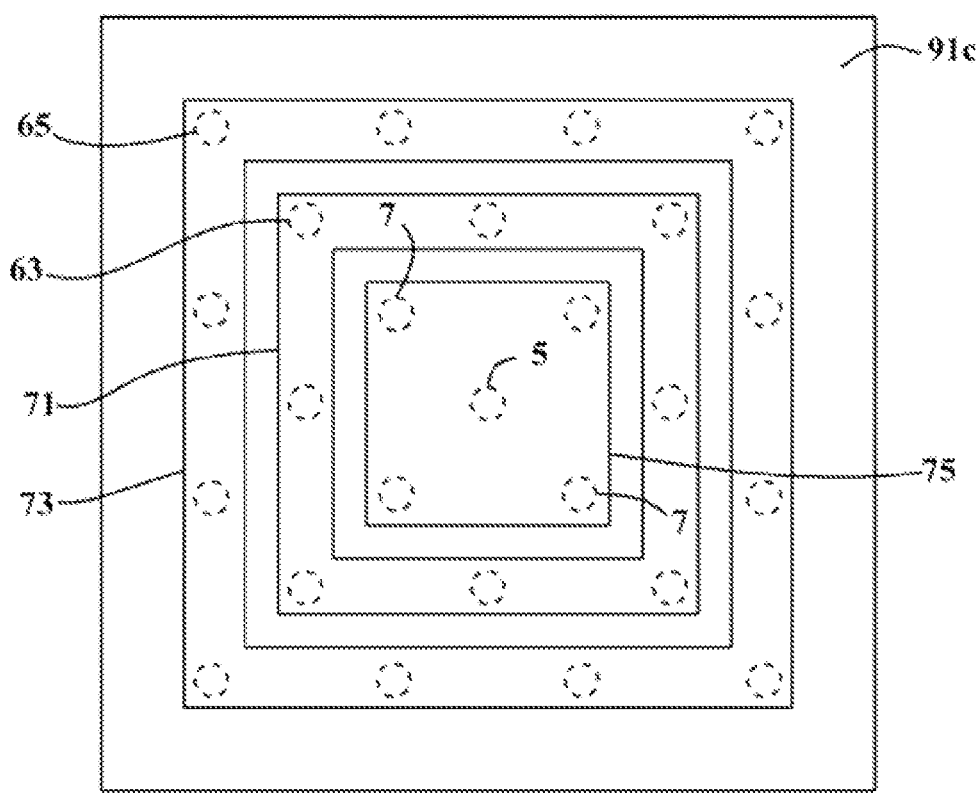

Referring next to FIG. 16, first, second and third connection electrodes 71, 75 and 73 are formed on the reflective layer 91. For example, the first, second and third connection electrodes 71, 75 and 73 may be deposited using sputtering or E-beam devices. The first, second and third connection electrodes 71, 75 and 73 may be formed of Cr, Ti, Ni or an alloy thereof, for stable electrical contacts, or alternatively, they may include metal reflective layers such as Al or Ag. The first connection electrode 71 may come into contact with the first semiconductor layer 30 through the plurality of first openings 63, and the second and third connection electrodes 75 and 73 may come into contact with the conductive film 60 through the plurality of second openings 5 and 7 and the plurality of third openings 65, respectively.

Next, as can be seen in FIG. 17, an insulating layer 95 covering the first, second and third connection electrodes 73 is formed. The insulating material 95 is typically made of $SiO_2$. Other examples may include SiN, $TiO_2$, $Al_2O_3$ and Su-8, but are not limited thereto. Then at least fourth opening 67, at least one fifth opening 68, and at least one sixth opening 69 are formed in the insulating layer 95.

Referring again to FIG. 17, a first electrode 81 and a second electrode 85 may be deposited on the insulating layer 95 using, for example, sputtering or E-beam devices. The first electrode 81 is connected to the first connection electrode 73 through the at least one fourth opening 67, and the second electrode 85 is connected to the second and third connection electrodes 75 and 73 through the at least one fifth opening 68 and the at least one sixth opening 69, respectively.

The first electrode 81 and the second electrode 85 can be electrically connected with an electrode prepared in the outside (package, COB, sub-mount, or the like) by means of a stud bump, conductive paste or eutectic bonding. In the case of eutectic bonding, it is important that the first electrode 81 and the second electrode 85 have comparable heights without much difference. In the semiconductor light emitting device according to this embodiment, the first electrode 81 has almost the same height as the second electrode 85 since they can be formed on the insulating layer 95 through the same process. In this regard, eutectic bonding is useful. When the semiconductor light emitting device is electrically connected to the outside through eutectic bonding, the top part of the first and second electrodes 81 and 85 may be formed of a eutectic bonding material such as an Au/Sn alloy or an Au/Sn/Cu alloy.

Figure 18:
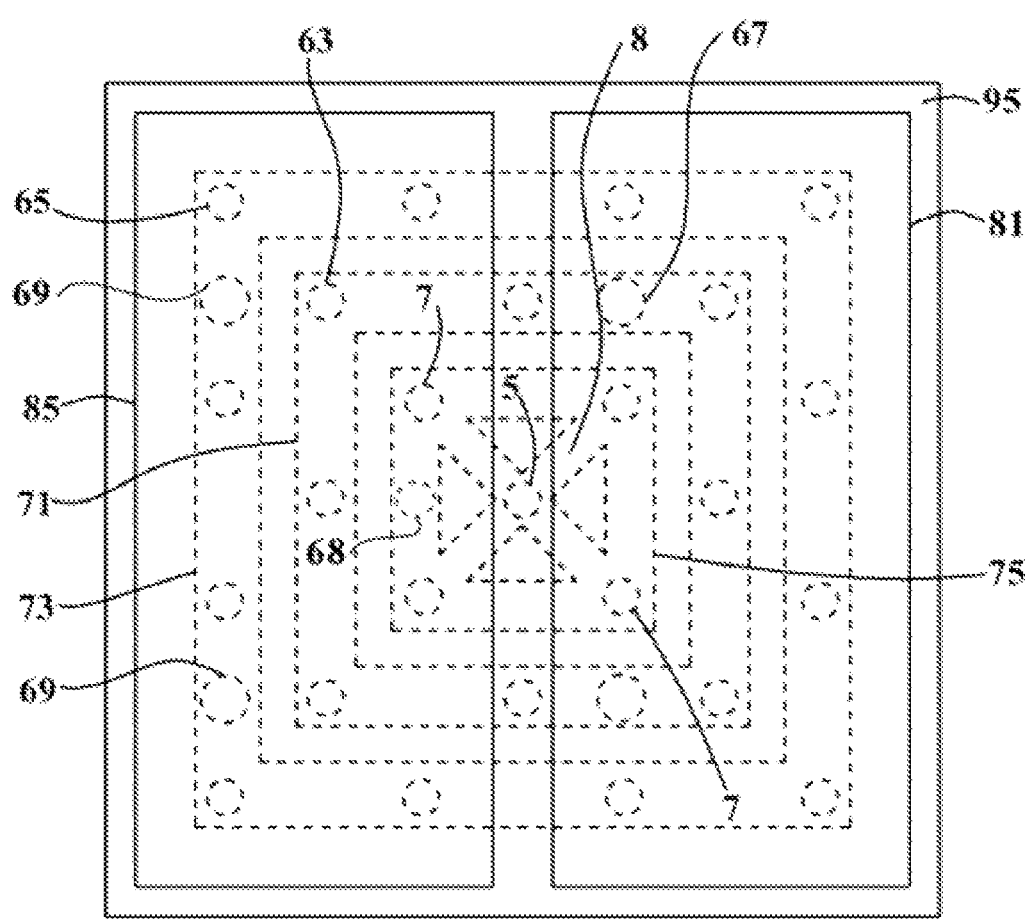
FIG. 18 is a view showing another exemplary embodiment of a semiconductor light emitting device in accordance with the present disclosure.

FIG. 18 is a view showing another exemplary embodiment of a semiconductor light emitting device in accordance with the present disclosure.

The semiconductor light emitting device is substantially the same as those semiconductor light emitting devices described in FIG. 12 through FIG. 17, except that the second connection electrode 75 has a different shape. Hence, common features will not be described to avoid redundancy.

The second connection electrode 75 may include a closed loop shape finger for connecting the plurality of peripheral openings 7, and a connecting finger 8 for connecting the internal opening 5 with the plurality of peripheral openings 7. In this way, the second connection electrode 75 has a reduced area, lowering an amount of light being absorbed.

Figure 19:
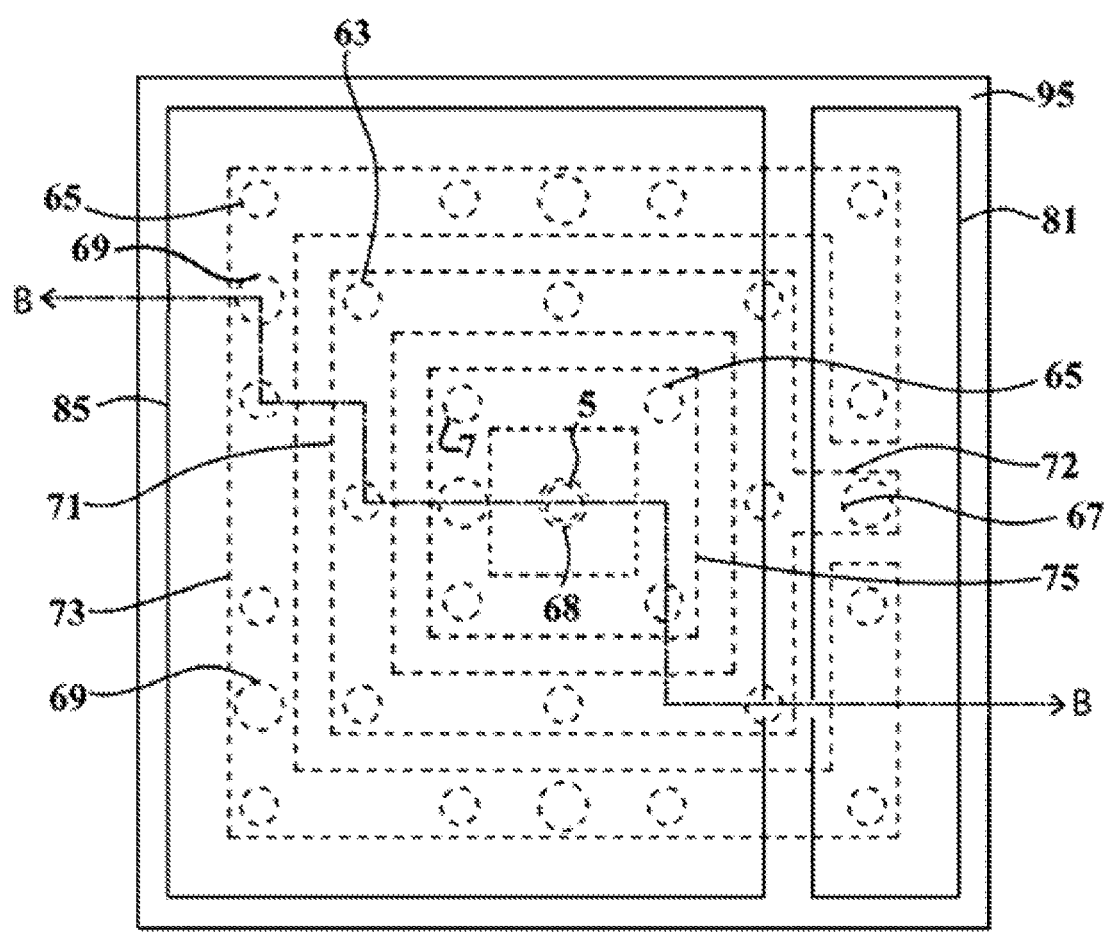
FIG. 19 is a view showing another exemplary embodiment of a semiconductor light emitting device in accordance with the present disclosure.
Figure 20:
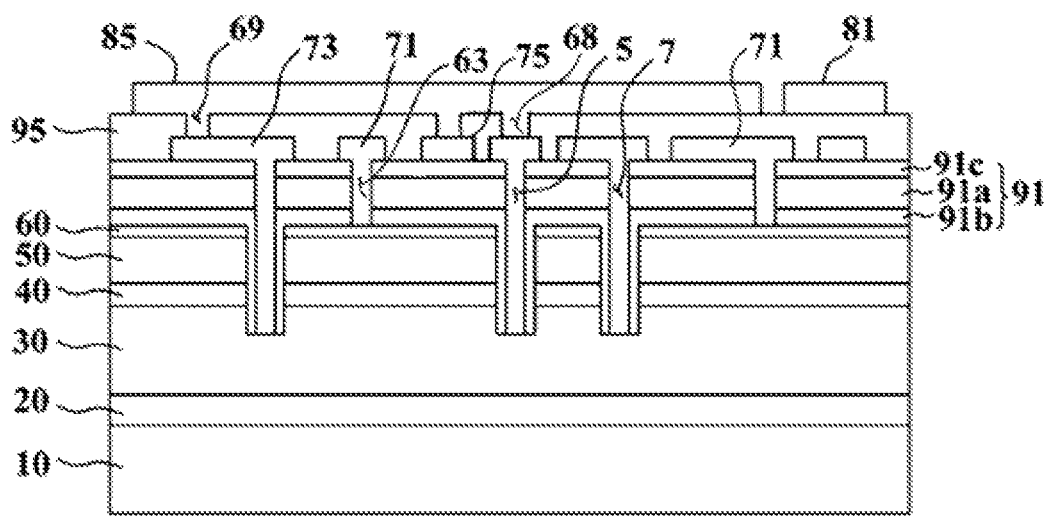
FIG. 20 is a cross-sectional view taken along line B-B in FIG. 19.

FIG. 19 is a view showing another exemplary embodiment of a semiconductor light emitting device in accordance with the present disclosure, and FIG. 20 is a cross-sectional view taken along line B-B in FIG. 19.

The semiconductor light emitting device is substantially the same as the semiconductor light emitting devices described in FIG. 12 through FIG. 17, except that the first connection electrode 71 supplies holes while the second and third connection electrodes 75 and 73 supply electrons, the second connection electrode 75 has a closed loop shape, the internal opening and the peripheral openings 7 are not directly connected together but are electrically connected together by the second electrode 85, the second electrode 85 is directly connected to the internal opening 5 through the fifth opening 68 formed in the insulating layer 95, the third connection electrode 73 has a partly open loop shape, the connecting finger 72 is extended from the first connection electrode 71 into the partly open slit of the third connection electrode 73, and the first electrode 81 has a smaller area than the second electrode 85. Hence, common features will not be described to avoid redundancy.

In this exemplary embodiment, light emission may be maintained or increased in the internal regions because of the internal opening 5 therein, which have a relatively high-density of electrons recombining with holes attracted from other regions.

The areas of the first and second electrodes 81 and 85 may vary as needed, and the connecting finger 72 may be added for electrical connection.

Figure 21:
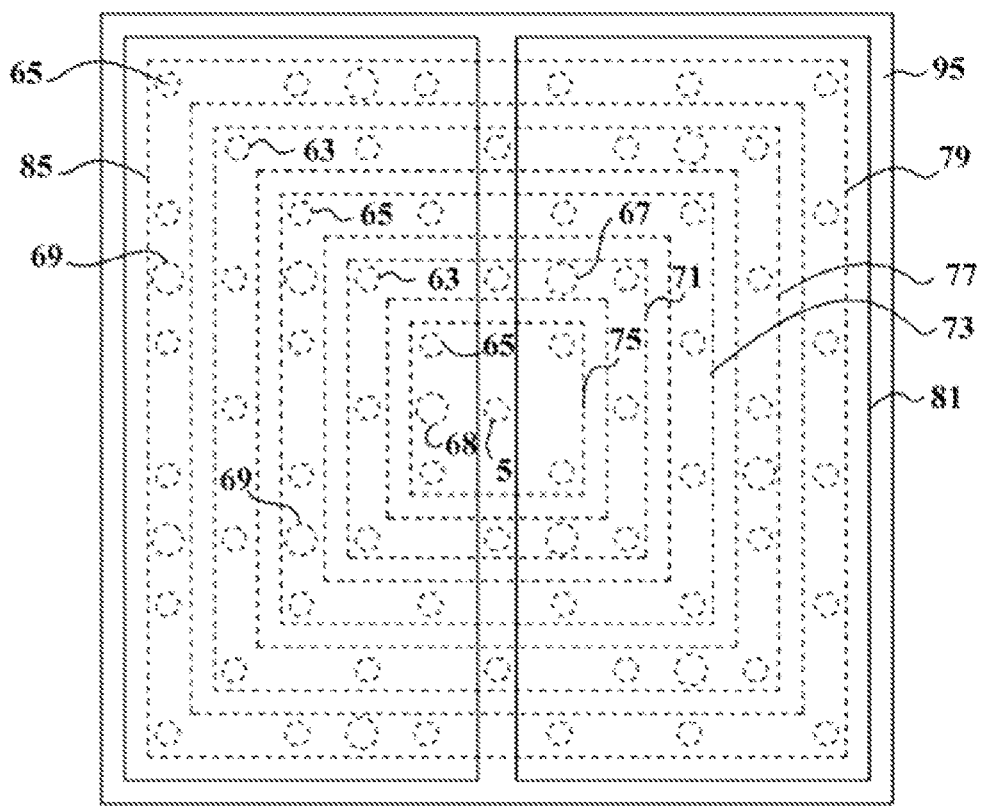
FIG. 21 is a view showing another exemplary embodiment of a semiconductor light emitting device in accordance with the present disclosure.

FIG. 21 is a view showing another exemplary embodiment of a semiconductor light emitting device in accordance with the present disclosure.

The semiconductor light emitting device is substantially the same as the semiconductor light emitting devices described in FIG. 12 through FIG. 17, except that the former includes an additional first connection electrode 77 for connecting the plurality of first openings 63 in a closed loop shape, and an additional third connection electrode 79 for connecting the plurality of third openings 65 in a closed loop shape. Hence, common features will not be described to avoid redundancy.

For larger semiconductor light emitting device sizes, such as large-area, high-power light emitting devices, more connection electrodes 77, 79 in a closed loop shape should be added in order to obtain a uniform current distribution. Such large-area semiconductor light emitting devices highly require high brightness. In this regard, the presence of the internal opening 5 as a contributing factor in maintaining and increasing light emission in the internal regions allows the semiconductor light emitting device in accordance with the present disclosure to be suitable for a large-area semiconductor light emitting device.

Figure 22:
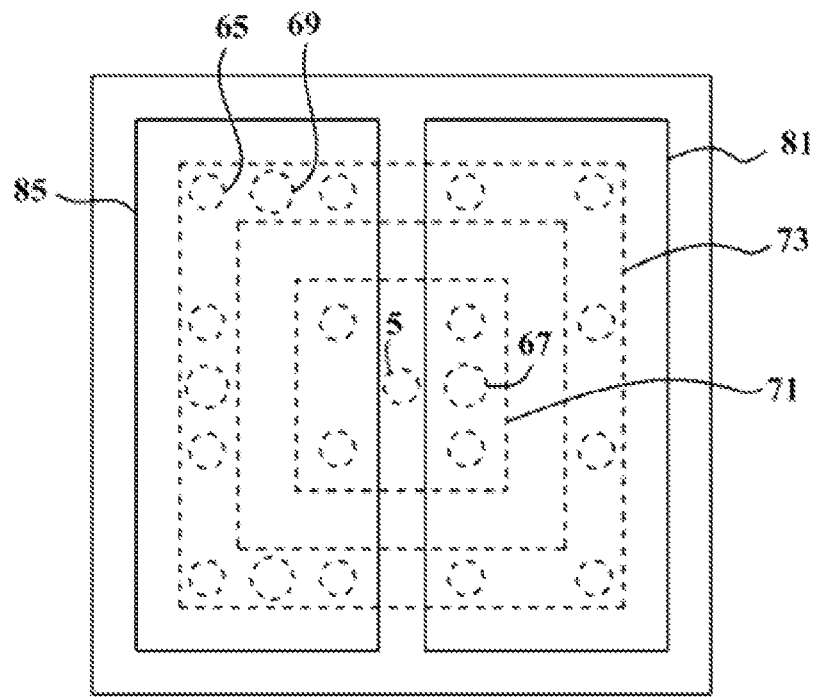
FIG. 22 is a view showing another exemplary embodiment of a semiconductor light emitting device in accordance with the present disclosure.

FIG. 22 is a view showing another exemplary embodiment of a semiconductor light emitting device in accordance with the present disclosure.

The semiconductor light emitting device is substantially the same as the semiconductor light emitting devices described in FIG. 12 through FIG. 17, except that the third connection electrode is omitted, and the number of the first openings 63 that are connected by the first connection electrode is increased. Hence, common features will not be described to avoid redundancy.

For a small semiconductor light emitting device, having two connection electrodes 71 and 73 is sufficient to obtain a uniform current distribution. Further, the presence of the internal opening 5 in the internal region can maintain or increase light emission such that light may be emitted as much as possible despite the reduced light emitting area.

Figure 23:
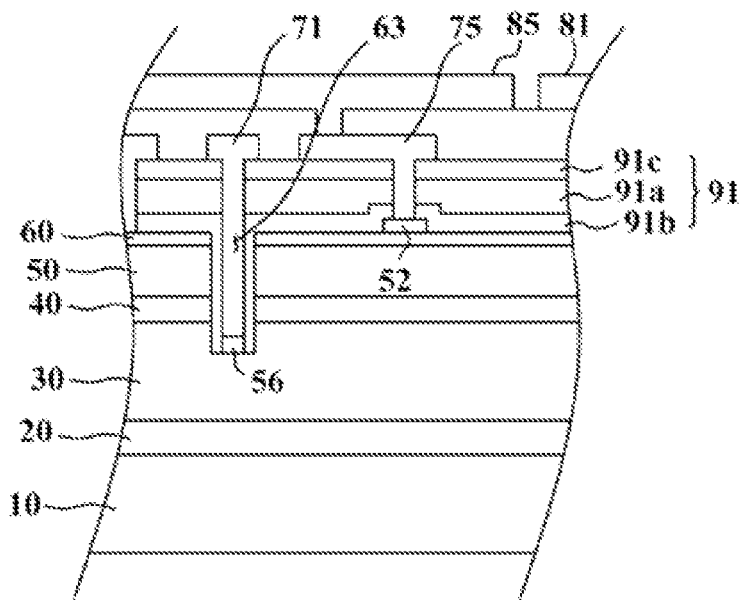
FIG. 23 is a view showing another exemplary embodiment of a semiconductor light emitting device in accordance with the present disclosure.

FIG. 23 is a view showing another exemplary embodiment of a semiconductor light emitting device in accordance with the present disclosure.

The semiconductor light emitting device is substantially the same as the semiconductor light emitting devices described in FIG. 12 through FIG. 17, except that an ohmic contact layer 52 is formed on the light-transmitting conductive film 60, corresponding to the second opening 63, and another ohmic contact layer 56 is formed between the first connection electrode 71 and the first semiconductor layer 30. Hence, common features will not be described to avoid redundancy.

The first connection electrode 71 is extended to the first opening 63 and comes into contact with the ohmic contact layer 56, and the second connection electrode 75 is extended to the second opening 5 and comes into contact with the ohmic contact layer 52. The ohmic contact layers 52 and 56 may be formed of an ohmic metal (e.g., Cr, Ti or the like), a reflective metal (e.g. Al or Ag), or a combination thereof. Due to the presence of these ohmic contact layers 52 and 56, the semiconductor light emitting device can be operated at a lower voltage.

A light absorption barrier or a current block layer may be added between the second semiconductor layer 50 and the light-transmitting conductive film 60, corresponding to the ohmic contact layer 52.

FIG. 24 is a view showing another exemplary embodiment of a semiconductor light emitting device in accordance with the present disclosure.

Figure 24A:
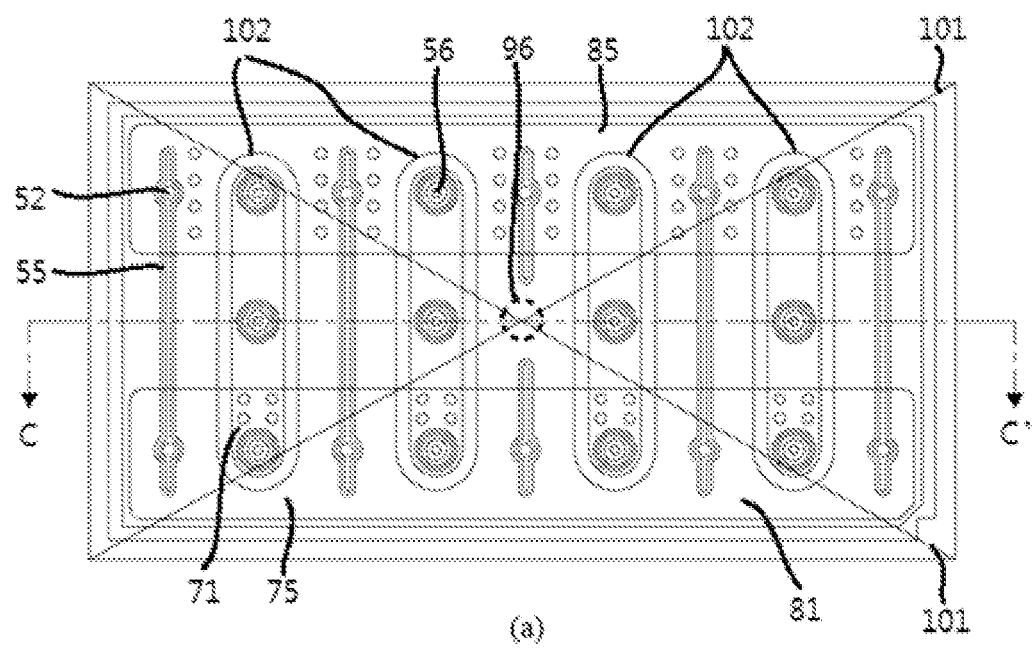
FIGS. 24(a) and 24(b) are views showing another exemplary embodiment of a semiconductor light emitting device in accordance with the present disclosure.
Figure 24B:
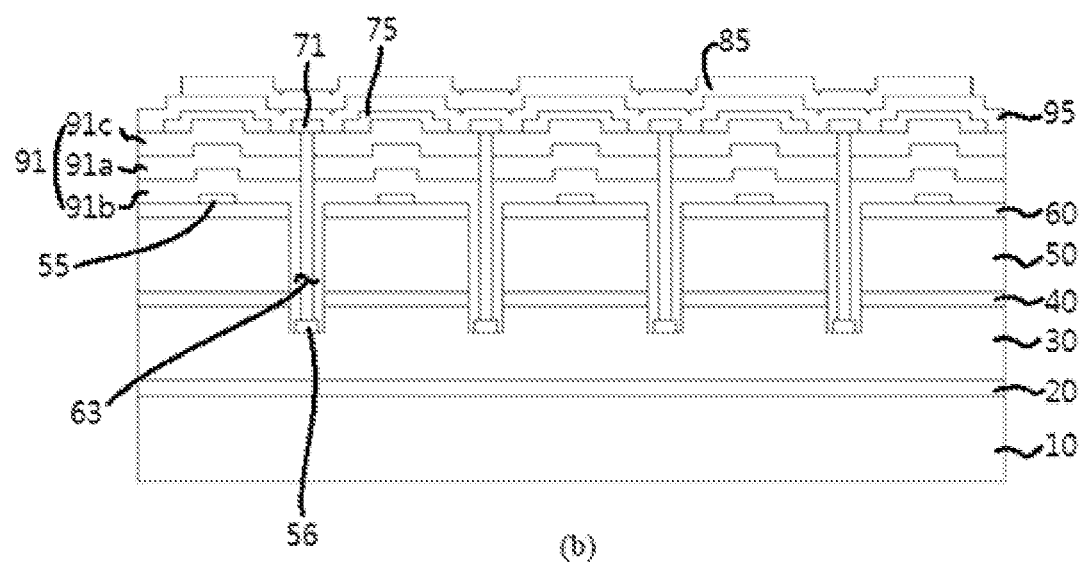

FIG. 24(a) is a plan view of the semiconductor light emitting device as seen from the top, and FIG. 24(b) is a cross-sectional view of the semiconductor light emitting device of FIG. 24(a), which was taken along C-C'.

In this exemplary embodiment, the semiconductor light emitting device includes a plurality of semiconductor layers 30, 40 and 50, a non-conductive reflective film 91, an insulating layer 95, a first electrode part 56, 71 and 81, and a second electrode part 52, 55, 75 and 85. The plurality of semiconductor layers 30, 4 and 50 includes a first semiconductor layer 30, a second semiconductor layer 50 and an active layer 40. The first semiconductor layer 30 has a first conductivity, and the second semiconductor layer 50 has a second conductivity different from the first conductivity. The active layer 40 is interposed between the first semiconductor layer 30 and the second semiconductor layer 50 and adapted to generate light by recombination of electrons and holes. The non-conductive reflective film 91 is formed on the plurality of semiconductor layers 30, 40 and 50, and reflects light generated by the active layer 40 towards the first semiconductor layer 30. In this exemplary embodiment, the non-conductive reflective film 91 on the plurality of semiconductor layers 30, 40 and 50 is made of a non-conductive reflective material for reducing light absorption by the metal reflective film. It is desirable that the non-conductive reflective film 91 functions as a reflective film, yet it is made of light transmitting materials for avoiding light absorption. The non-conductive reflective film 91 may be formed of light-transmitting dielectric materials such as $SiO_x$, $TiO_x$, $Ta_2O_5$, or $Mg\ F_2$. When the non-conductive reflective layer 91 is made of $SiO_x$, it has a lower refractive index than the refractive index of the p-type semiconductor layer 50 (e.g., GaN) such that the light incident at a greater angle than the critical angle will partly be reflected towards the plurality of semiconductor layers 30, 40, 50. Meanwhile, when the non-conductive reflective film 91 is made of a DBR (e.g., DBR composed of the $SiO_2$ and $TiO_2$ pairs), a greater amount of incident light will be reflected towards the plurality of semiconductor layers 30, 40, 50. The insulating layer 95 is formed on the non-conductive reflective film 91. The insulating layer 95 may be made of a dielectric (e.g., $SiO_2$).

The first electrode part 56, 71 and 81 and the second electrode part 52, 55, 75 and 85 each include an upper electrode 81, 85. The first electrode part 56, 71 and 81 is electrically connected to the first semiconductor layer 30, and the second electrode part 52, 55, 75, and 85 is electrically connected to the second semiconductor layer 50. The first electrode part 56, 71 and 81 supplies either electrons or holes to the first semiconductor layer 30, and the second electrode part 52, 55, 75, and 85 supplies the other of the holes or the electrons to the second semiconductor layer 50. A central region 96 of the semiconductor light emitting device is formed on the insulating layer 95, and between the upper electrodes 81 and 85. As shown in FIG. 24(a), the intersection of two diagonal solid lines 101 connecting two nonadjacent corners of the semiconductor light emitting device is the center of the semiconductor light emitting device, and a certain area around this center of the semiconductor light emitting device is called the central region 96. In particular, it is desirable that the insulating layer 95 in the central region is flat.

The insulating layer 95 is preferably flat in the central region in order to prevent cracks from occurring in the non-conductive reflective film 91 or the insulating layer 95. Once the semiconductor light emitting device is fabricated, it needs to be separated from a tape, and this is done by raising the semiconductor light emitting device up by a pin. To be more specific, the insulating layer 95 in the central region 96 in the semiconductor light emitting device is the one being raised up by the pin. At this time, if the central region 96 on the top layer has a bump or is not flat, the non-conductive reflective film 91 or the insulating layer 95 in the central region 96 is likely to have a crack or cut. When the non-conductive reflective film 91 or the insulating layer 95 has a crack or cut, it results in deteriorated performance, poor insulation, and lowered reliability of the semiconductor light emitting device.

When a finger electrode 55, which is thin and elongated, is formed below the insulating layer 95 in the central region 96, this insulating layer 95 may end up with having a bump or being a non-flat form as the finger electrode 55 passes below the insulating layer 95 where the central region 96 formed. In addition, when connection electrodes 71 and 75 narrower than the central region 96 are formed below the insulating layer 95 in the central region 96, the insulating layer 95 in the central region 96 may also end up with having a bump or being a non-flat form. Again, when part of the connection electrodes 71 and 75 pass below the insulating layer 95 in the central region 96, the central region 96 may have a bump or be a non-flat form.

Therefore, to make the insulating layer 95 flat in the central region 96, it is desirable that the finger electrode 55 should not be formed below the insulating layer 95 in the central region 96, or should be broader than the central region 95. In addition, it is desirable that the connection electrodes 71 and 75 should not be formed below the insulating layer 95 in the central region 96, or should be broader than the central region 95. Further, it is desirable that the finger electrode 55 should not be formed below the insulating layer 95 in the central region 96.

However, making the finger electrode 55 broader than the central region 95 is not really adopted because it can lower brightness of the semiconductor light emitting device. If there is a way to prevent the finger electrode 55 from absorbing light, the approach of making the finger electrode 55 broader than the central region 95 can be used as well in combination.

The pin has a diameter of 32 μm, and the central region 96 preferably has a greater diameter than the pin. The diameter of the central region 96 may vary depending on the diameter of the pin.

The finger electrode 55 included in the second electrode part 52, 55, 75 and 85 is formed on the second semiconductor layer 50 and under the non-conductive reflective film 91. The finger electrode 55 is formed on the second semiconductor layer 50 lengthways to spread current to the second semiconductor layer 50. The finger electrode 55 is made of a metal and it preferably has a narrow width because the metal absorbs light. Moreover, the finger electrode 55 is formed like islands, without going through the central region 96.

The connection electrodes 71 and 75 included in the first electrode part 56, 71 and 81 and the second electrode part 52, 55, 75 and 85, respectively, are formed on the non-conductive reflective film 91. These connection electrodes 71 and 75 are preferably formed broad enough to cover most of the non-conductive reflective film 91. In this way, the connection electrodes 71 and 75 on the non-conductive reflective film 91 can absorb the shock from the pin, preventing the occurrence of a crack or cut in the non-conductive reflective film 91. In general, the connection electrodes 71 and 75 are made of metals. This means that the connection electrodes 71 and 75 can also absorb light and therefore, they should preferably be made narrow to increase brightness of the semiconductor light emitting device. However, the inventors found out that the non-conductive reflective film 91 reflects light mostly towards to the first semiconductor layer 30 and only a small amount of the light enters the connection electrodes 71 and 75, leaving even a portion of the light being absorbed by the connection electrodes 71 and 75. Hence, the connection electrodes 71 and 75 being broad does not really affect brightness of the semiconductor light emitting device. Instead, the connection electrodes 71 and 75 are rather formed in a broader shape on the non-conductive reflective film 91 so as to increase stability and reliability of the semiconductor light emitting device. Here, one of the connection electrodes 71, 75 forms a plurality of openings 102, and the other of the connection electrodes 71, 75 is formed within the plurality of openings 102. For example, as shown in FIG. 24(a), the connection electrode 75 having the plurality of openings 102 is formed, and the connection electrode 71 is formed within the plurality of openings 102.

The finger electrode 55 is formed on the second semiconductor layer 50. The connection electrode 75 formed on the non-conductive reflective film 91 is electrically connected to the finger electrode 55 and the connection electrode 75 through those two, second openings 65 formed in the non-conductive reflective film 91. As a result, even after the finger electrode 55 is removed from the central region 96, the finger electrode 55 and the connection electrode 75 are electrically connected to the second semiconductor layer 50. Although not shown, the connection electrode 71 and a plurality of ohmic contact layers 56 are electrically connected through the plurality of first openings 63. There is no constraint on whether the connection electrode 75 is electrically connected to the first semiconductor layer 30 or the second semiconductor layer 50.

FIG. 25 is a view showing other exemplary embodiments of a semiconductor light emitting device in accordance with the present disclosure.

Figure 25A:
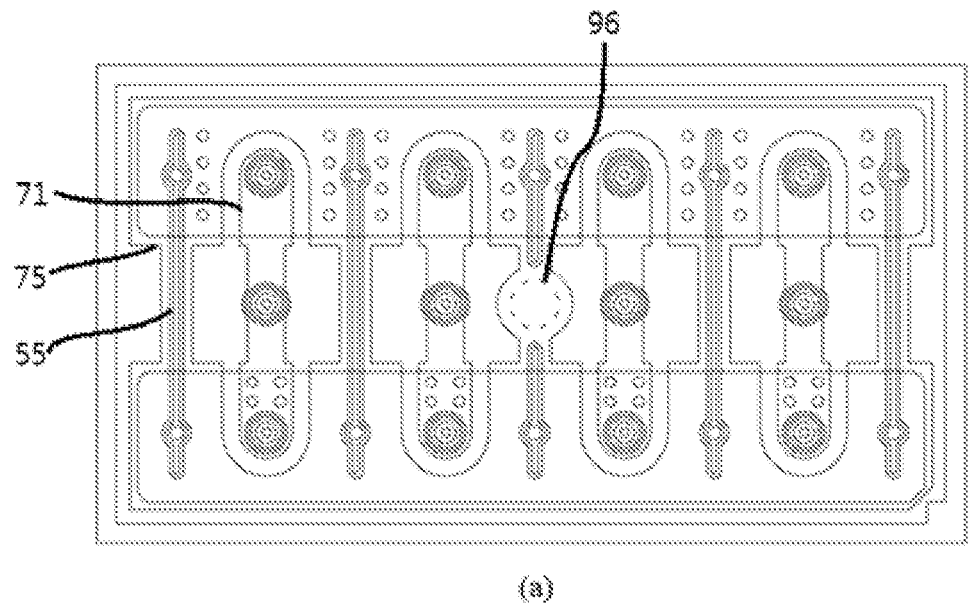
FIGS. 25(a) and 25(b) are views showing other exemplary embodiments of a semiconductor light emitting device in accordance with the present disclosure.
Figure 25B:
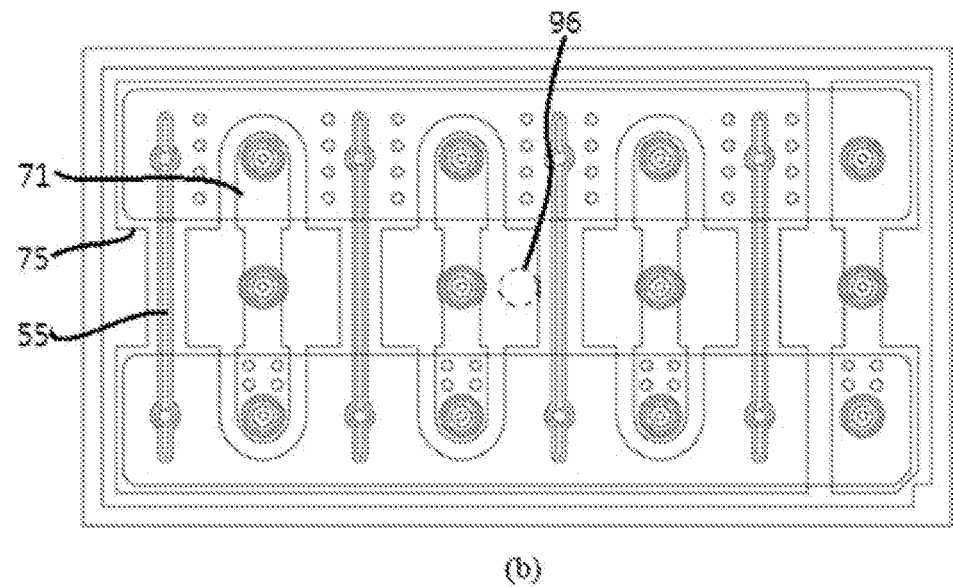

FIG. 25(a) and FIG. 25(b) are plan views of the semiconductor light emitting devices as seen from the top. These semiconductor light emitting devices of FIG. 25(a) and FIG. 25(b) are exemplary embodiments, with each having a least portion allocated for the connection electrodes 71 and 75 that absorb light and possibly lower brightness of the semiconductor light emitting device.

FIG. 25(a) illustrates a case that more than one connection electrode 71, 75 may be formed below the insulating layer 95 where the central region 96 is formed. The finger electrode 55 may be formed elsewhere than below the insulating layer 95 where the central region 96 is formed. The connection electrode 75 may be formed wider than the central region 96. As one or more of the connection electrodes 71 and 75 are formed on the non-conductive reflective film 91, the non-conductive reflective film 91 may be at least partly protected from cracks or cuts. The shape of the connection electrode 75 formed in the central region 96 is not particularly limited to a circular shape, as it may have a pin shape or may vary as needed.

FIG. 25(*b*) illustrates a case that none of the connection and finger electrodes 71, 75 and 55 is formed below the insulating layer 95 where the central region 96 is formed. Here, the central region 96 corresponds to a part where the connection and finger electrodes 71, 75 and 55 are not formed.

The semiconductor light emitting device is substantially the same as the semiconductor light emitting device shown in FIG. 24, except those features described above with reference to FIG. 25.

Figure 26A:
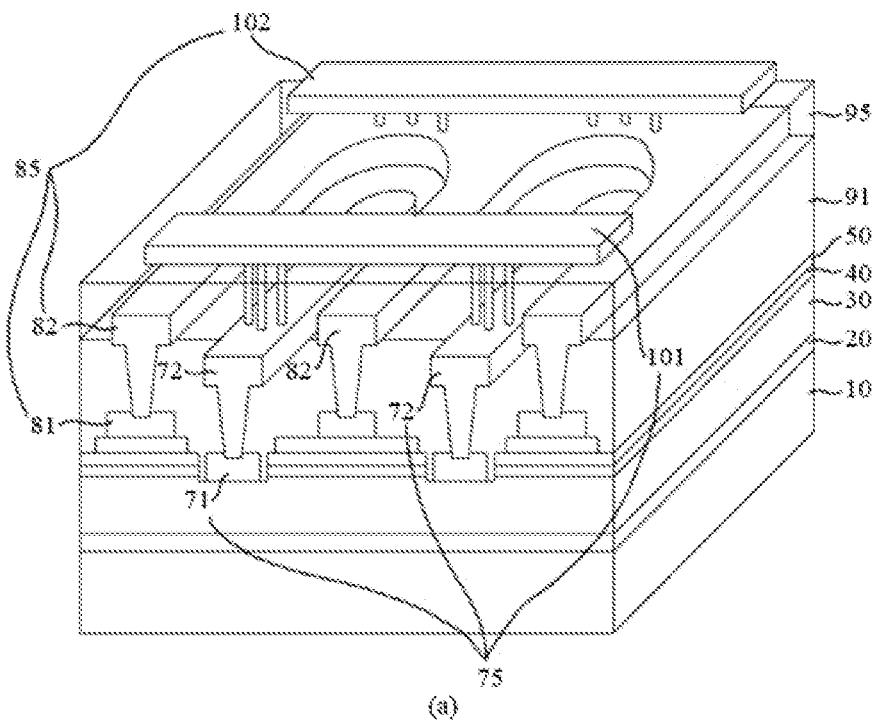
FIGS. 26(a) and 26(b) are views showing another exemplary embodiment of a semiconductor light emitting device in accordance with the present disclosure.
Figure 26B:
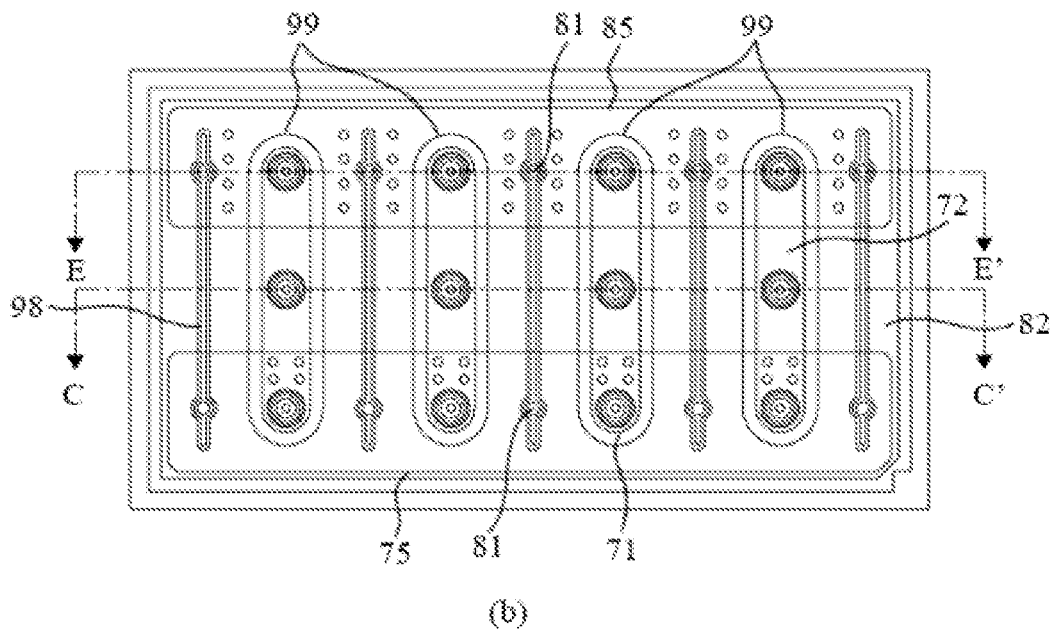

FIG. 26 is a view showing another exemplary embodiment of a semiconductor light emitting device in accordance with the present disclosure.

The semiconductor light emitting device includes a plurality of semiconductor layers 30, 40 and 50, a non-conductive reflective film 91, an insulating layer 95, a first electrode part 75, and a second electrode part 85. As shown, the first and second electrode parts 75 and 85 each may have lower electrodes 71 and 81, a finger electrode 98, connecting electrodes 72 and 82, and bonding pads 101 and 102, respectively. The plurality of semiconductor layers 30, 40 and 50 includes a first semiconductor layer 30, a second semiconductor layer 50 and an active layer 40. The first semiconductor layer 30 has a first conductivity, and the second semiconductor layer 50 has a second conductivity. The active layer 40 is formed between the first semiconductor layer 30 and the second semiconductor layer 50, and adapted to generate light. The non-conductive reflective film 91 is formed on the plurality of semiconductor layer 30, 40 and 50 to reflect light generated by the active layer towards the first semiconductor layer 30, and may be made of a dielectric. For example, the non-conductive reflective film 91 may be a DBR (Distributed Bragg Reflector). The insulating layer 95 is formed on the non-conductive reflective film 91. The insulating layer 95 can be a dielectric, such as $SiO_2$. The first electrode part 75 is electrically connected to the first semiconductor layer 30, and supplies either electrons or holes the first semiconductor layer 30. The second electrode part 85 is electrically connected to the second semiconductor layer 50, and supplies the other of the holes or the electrons to the second semiconductor layer 50. At least one of the first and second electrode parts 75 and 85 includes a connection electrode 72, 82. The connection electrode 72, 82 is formed between the non-conductive reflective film 91 and the insulating layer 95, and may cover over the non-conductive reflective film 91 by at least 50% thereof. As an alternative, one of the connection electrodes 72 and 82 may cover over the non-conductive reflective film 91 by at least 50% thereof, or a combined area of the connection electrodes 72 and 82 may cover over the non-conductive reflective film 91 by at least 50% thereof. The connection electrodes 72 and 82 may be made of a metal, preferably selected from Cr, Ti, Ni, Au, Ag, TiW, Pt, Al or the like, for example. In general, for the fabrication of the semiconductor light emitting device, the lower electrode 71, 81, the finger electrode 98, the connecting electrode 72, 82, and the bonding pad 101, 102 are formed of multiple metal layers. The bottom layer thereof should have a high bonding strength to an adhesive side. To this end, a material such as Cr or Ti is typically used, but other materials such as Ni, Ti or TiW can also be used as there are no particular limitations regarding this matter. Au is used for their top layers for wire bonding or for the connection with an external electrode. Moreover, in order to reduce the amount of Au used and to offset a relatively low hardness of Au, other material such as Ni, Ti, TiW or W can be employed between the bottom layer and the top layer, depending on the specifications required. Also, when a high reflectance is required, Al or Ag can be used.

Preferably, the connection electrode 82 of the second electrode part 85 forms a plurality of openings 99, and the connection electrode 72 of the first electrode part 75 may be arranged within the plurality of openings 99. In addition, at least one of the first and second electrode parts 75 and 85 may include the finger electrode 98. The finger electrode 98 is formed between the plurality of semiconductor layers 30, 40 and 50 and the non-conductive reflective film 91, and the finger electrode 98 and the connection electrode 72, 82 can be electrically connected.

The insulating layer 95 covering over the non-conductive reflective film 91 has a refractive index similar to that of the non-conductive reflective film 91 such that light is not reflected but easily transmitted therethrough. Thus, a part of the light that was not reflected by the non-conductive reflective film 91 escapes through the insulating layer 95, resulting in a reduced light extraction efficiency. By fully covering the non-conductive reflective film 91 with the connection electrode 72, 82, it is possible to reflect the light being escaped through the insulating layer 95. For example, the connection electrode 82 of the second electrode part 85 covers over the entire non-conductive reflective film 91. Preferably, the openings 99 are formed by the second electrode part 85 at this time, and the first electrode part 75 is allowed to pass through the openings 99. The first electrode part 75 may or may not include the connection electrode 72. If the first electrode part 75 includes the connection electrode 72, this connection electrode can be formed into islands within the plurality of openings 99, respectively, of the connection electrode 82 of the second electrode part 85. The number of islands of the connection electrode 72 to be formed within the openings 99 may be determined by the number the openings 99 available by the connection electrode 82 on the non-conductive reflective film 91. In addition, it is desirable that only the first electrode part 75 is formed within the openings 99 of the second electrode part 85. If the first electrode part 75 forms openings on the non-conductive reflective film 91, it is then desirable that only the second electrode 85 is formed within the openings 99 of the first electrode part 75.

Accordingly, the connection electrodes 72 and 82 can thus reflect even a part of the light that was not reflected by the non-conductive reflective film 91, and emit the light outside the semiconductor light emitting device, enhancing the light extraction efficiency.

Figure 27A:
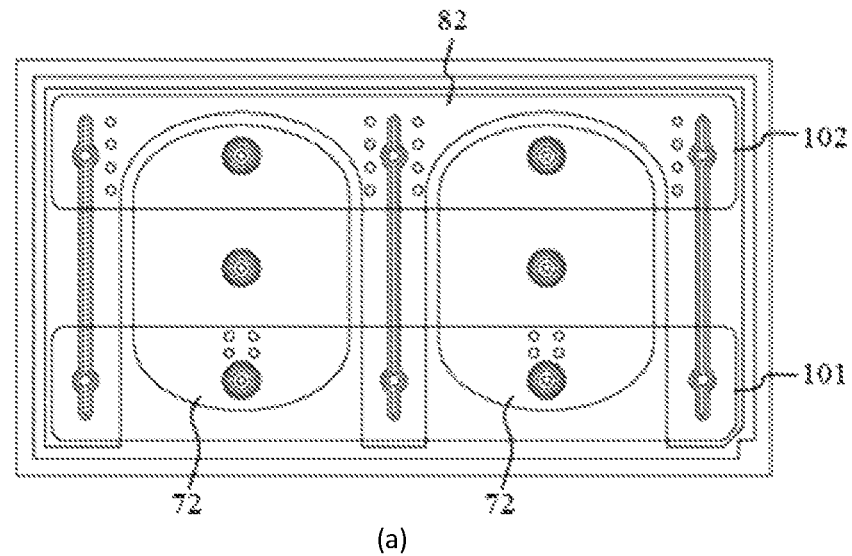
FIGS. 27(a) and 27(b) are views showing another exemplary embodiment of a semiconductor light emitting device in accordance with the present disclosure.

FIG. 27 is a view showing another exemplary embodiment of a semiconductor light emitting device in accordance with the present disclosure.

FIG. 27(*a*) illustrates a case where one of the connection electrodes 72 and 82 in the form of a plurality of islands cover over the non-conductive reflective film 91 by at least 50% thereof. The connection electrode 72 of the first electrode part 75 forms a plurality of islands, and the connection electrode 82 of the second electrode part 85 is formed such that it only encloses a part, not all, of the first electrode part 75, with one side thereof being connected as shown in FIG.

4(a). The connection electrode 82 of the second electrode part 85 can be formed into a plurality of islands.

Figure 27B:
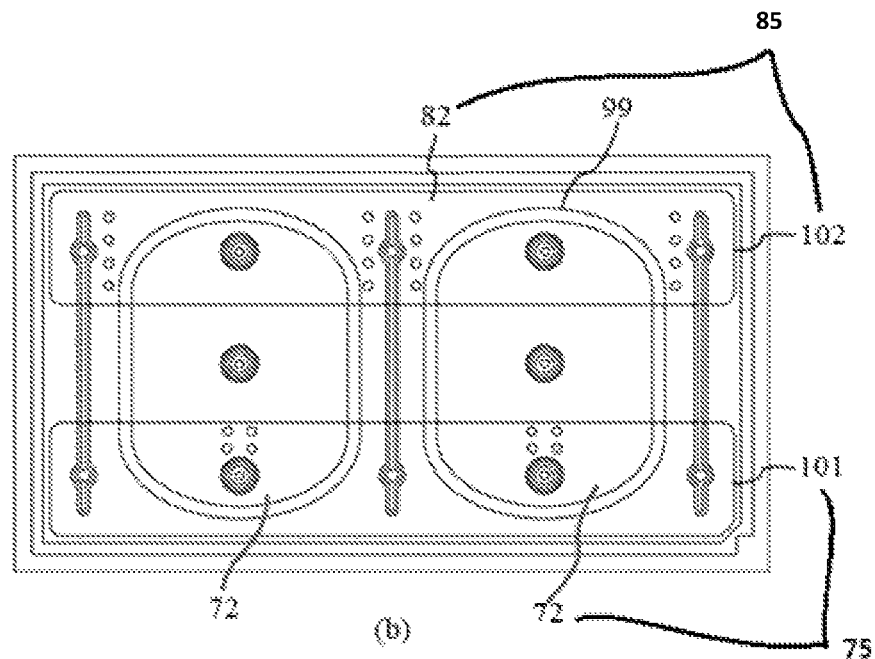

FIG. 27(b) illustrates a case that one of the connection electrodes 72, 82 forms a plurality of islands covering over the non-conductive reflective film 91 by at least 50% thereof, and the other of the connection electrodes 72, 82 encloses the plurality of islands. The connection electrode 72 of the first electrode part 75 forms a plurality of islands, and the connection electrode 82 of the second electrode part 85 forms a plurality of openings 99. The islands are arranged in the plurality of openings 99, respectively, and the plurality of islands covers over the non-conductive reflective film by at least 50% thereof.

Figure 28:
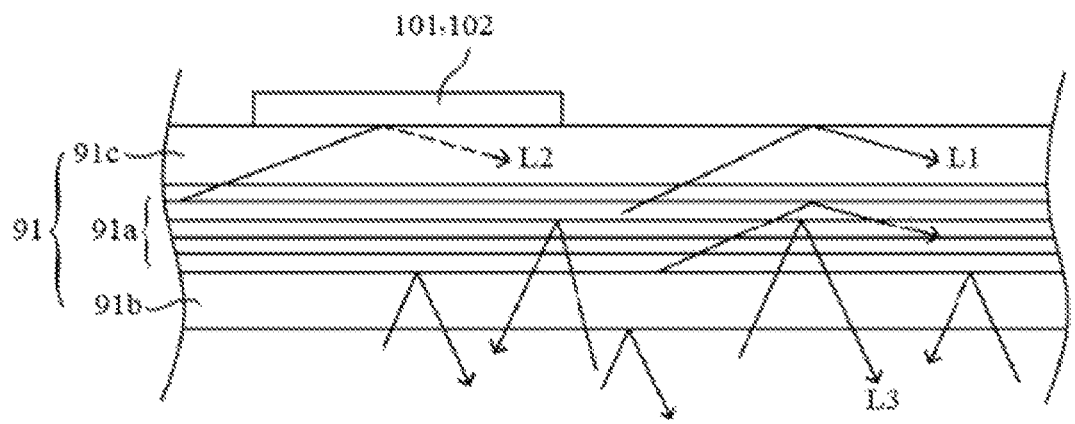
FIG. 28 is a view showing another exemplary embodiment of a semiconductor light emitting device in accordance with the present disclosure.

FIG. 28 is a view showing another exemplary embodiment of a semiconductor light emitting device in accordance with the present disclosure.

The non-conductive reflective film 91 may have a single dielectric layer or a multilayered structure. In this exemplary embodiment, the non-conductive reflective film 91 is made of a non-conductive reflective material for reducing light absorption by such a metal reflective film. One example of the multilayered structure of the non-conductive reflective film 91 includes a dielectric film 91b, a DBR 91a, and a clad film 91c.

During the fabrication of a semiconductor light emitting device in accordance with this embodiment, step coverage is created due to a structure like the lower electrode 71, 82 (see FIG. 26). As the deposition of the DBR 91a needs to be done with high precision, the dielectric film 91b having a uniform thickness may be formed before the deposition such that the DBR 91a can be prepared in a stable manner, and light reflection can also benefit therefrom.

Preferably, the dielectric film 91b is made of a suitable material like $SiO_2$, and has a thickness of 0.2 to 1.0 μm. If the dielectric film 91b is too thin, it may not be able to sufficiently cover the lower electrodes 71 and 81 which have a height of 2 to 3 μm; while if the dielectric film 91b is too thick, it may make it difficult to form openings 62 and 63 therein. In addition, the dielectric film 91b needs to be formed with a suitable method for ensuring the reliability of the semiconductor light emitting device. For example, the dielectric film 91b made of $SiO_2$ is preferably formed by CVD (Chemical Vapor Deposition), and more particularly by PECVD (Plasma Enhanced CVD). This is because CVD is more advantageous than PVD (Physical Vapor Deposition) such as E-Beam evaporation, in terms of achieving improved step coverage. More specifically, if the dielectric film 91b is formed by E-Beam evaporation, it is difficult to form the dielectric film 91b in the intended thickness in a region having the step coverage, the reflectance may be lowered, and the electrical insulation may be deteriorated. As such, the dielectric film 91b is preferably formed by CVD for reducing the step coverage and ensuring the insulation effect. In this way, it is possible to secure the reliability of the resulting semiconductor light emitting device and the functions of the dielectric film as a reflective film.

The DBR 91a is formed on the dielectric film 91b. The DBR 91a is composed of a stack of alternating $SiO_2$ and $TiO_2$ pairs. In an alternative, the DBR 91a may be composed of a combination of a higher refractive index material such as $Ta_2O_5$, HfO, ZrO, SiN or the like and a lower refractive index dielectric thin film (typically, $SiO_2$). For example, the DBR 91a may be composed of a stack of alternating $SiO_2/TiO_2$, $SiO_2/Ta_2O_2$, or $SiO_2/HfO$ pairs, in which the $SiO_2/TiO_2$ demonstrates a high blue-light reflection efficiency, while $SiO_2/Ta_2O_2$ or $SiO_2/HfO$ demonstrates a high UV-ray reflection efficiency. If the DBR 91a is composed of $SiO_2/TiO_2$, it should preferably undergo an optimization process in consideration of an angle of incidence as well as wavelength-dependent reflectivity, using a ¼ optical thickness of the wavelength of the light emitted from the active layer 40 (see FIG. 26), yet it is not absolutely required that each layer should have a ¼ optical thickness of the wavelength. The number of combination pairs in the stack is suitably between 4 and 40 pairs. If the DBR 91a is composed of a stack of alternating $SiO_2/TiO_2$ pairs, the DBR 91a is preferably formed by PVD (Physical Vapor Deposition), and more particularly, E-Beam evaporation, sputtering or thermal evaporation.

The clad layer 91c may be made of a metal oxide such as $Al_2O_3$, a dielectric material such as $SiO_2$ or SiON, or other materials such as MaF or CaF. Preferably, the clad layer 91c has a thickness ranging from $\lambda/4n$ to 3.0 μm, in which λ denotes a wavelength of the light generated from the active layer 40, and n denotes a refractive index of a material of the clad layer 91c. If λ is 450 nm (4500 Å), the clad layer 91c can be formed in a thickness of 771 Å (4500/4×1.46=771 Å) or more.

Considering that the top layer of the DBR 91a made of multiple pairs of $SiO_2/TiO_2$ can be made of a $SiO_2$ layer having a thickness of $\lambda/4n$, it is desirable that the clad film 91c is thicker than $\lambda/4n$ to be distinguished from the top layer of the DBR 91a that is underlaid the clad film 91c. However, it is not desirable for the top layer of the clad film 91c to be too thick (e.g., 3 μm or more) as it imposes a burden on the subsequent perforation process and only increases the material cost without contributing to the improvement of the efficiency. Therefore, a maximum thickness of the clad layer 91c preferably falls within the range of 1 to 3 μm, not to impose any burden on the subsequent processes. Depending on the case, however, it is yet acceptable to make the top layer as thick as 3.0 μm or more.

The DBR 91a preferably has a higher effective refractive index than the refractive index of the dielectric film 91b for light reflection and guidance. If the DBR 91a and the pad electrode 101, 102 come in direct contact with each other, a portion of the light travelling through the second non-conductive reflective film R2 may be absorbed by the electrode 101, 102. This light absorption by the electrode 101, 102 can be substantially reduced by incorporating the clad film 91c having a lower refractive index than the DBR 91a. With these refractive indices thus selected, the dielectric film 91b—DBR 91a—clad film 91c can be explained in view of an optical waveguide. The optical waveguide is a structure that encloses a propagation part of light by a material having a lower refractive index than the propagation part of light and directs the light by total reflection. In this regard, if the DBR 91a can be taken as the propagation part, the dielectric film 91b and the clad film 91c can be taken as part of the optical waveguide that encloses the propagation part.

For example, when the DBR 91a is made of a light-transmitting material (e.g., $SiO_2/TiO_2$) for preventing light absorption, the dielectric film 91b may be made of a dielectric material (e.g. $SiO_2$) having a lower effective refractive index than the DBR 91a. Here, the effective refractive index means an equivalent refractive index of light that can travel in a waveguide made of materials having different refractive indices. The clad film 91c may also be made of a material having a lower effective refractive index than the DBR 91a (e.g., $Al_2O_3$, $SiO_2$, SiON, MgF, or CaF). If the DBR 91a is composed of $SiO_2/TiO_2$, with $SiO_2$ having a refractive index of 1.46 and $TiO_2$ having a refractive index of 2.4, an effective refractive index of the DBR will have a value between 1.46 and 2.4. Accordingly, the dielectric film 91b can be composed of SiO$_2$, and a suitable thickness for it would be between 0.2 and 1.0 µm. Moreover, the clad film 91c may also be composed of SiO$_2$ having a refractive index of 1.46 which is lower than the effective refractive index of the DBR 91a.

Although not desirable from the perspective of the optical waveguide, the dielectric film 91b may optionally be omitted to go along with the general technical ideas of the present disclosure, yet the configuration including the DBR 91a and the clad layer 91c does not need to be excluded either. Further, as another alternative, the dielectric film 91b made of a dielectric TiO$_2$ may be included, instead of the DBR 91a. If the DBR 91a has a SiO$_2$ layer on its top, it is also optional to omit the clad film 91c. Moreover, when the dielectric film 91b and the DBR 91a are designed in consideration of the reflectance of light traveling substantially in the transverse direction, the clad film 91c may also be omitted in the case where the DBR 91a has a TiO$_2$ layer on its top.

In short, the dielectric film 91b, the DBR 91a and the clad film 91c, each being present as the non-conductive reflective film 91, can serve as an optical waveguide, and their combined thickness preferably ranges from 1 to 8 µm.

As illustrated in FIG. 28, the DBR shows a higher reflectance (e.g., approximately 99% or more) towards light L3 incident almost in the normal direction. However, lights L1 and L2 incident at an angle are transmitted through the DBR 91a and enter the top face of the clad film 91c or non-conductive reflective film 91. The light L1 is mostly reflected in a region not covered by the pad electrode 101, 102, while the light L2 incident on the pad electrode 101, 102 is partly absorbed.

Figure 29:
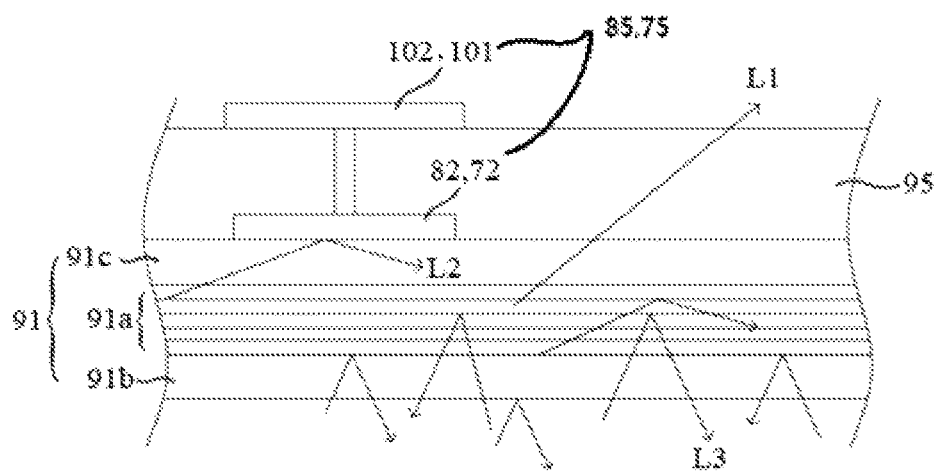
FIG. 29 is a view describing light reflection on a non-conductive reflective film and a connection electrode.

FIG. 29 is a view describing light reflection on a non-conductive reflective film and a connection electrode.

A part of the light from the active layer 40 (see FIG. 26) is emitted towards the non-conductive reflective film 91. The emitted light is reflected by the non-conductive reflective film 91, but a part of it is transmitted instead (L1). This occurs because the light emitted towards the insulating layer 95 can easily escape through the insulating layer 95 from the non-conductive reflective film 91 as the insulating layer 95 and the non-conductive reflective film 91 have similar reflectances. In order to prevent the light from escaping through the insulating layer 95, the connection electrode 72, 82 may be formed such that it covers most of the non-conductive reflective film 91 and reflects light towards the plurality of semiconductor layers.

FIG. 30 is a view showing another exemplary embodiment of a semiconductor light emitting device in accordance with the present disclosure.

In the following, the connection electrode 72 (see FIG. 26) having a first conductivity will be described in terms of a first connection electrode 112 and a first lower electrical connection 113, and the connection electrode 82 (see FIG. 26) having a second conductivity will be described in terms of a second connection electrode 122 and a second lower electrical connection 123. The pad electrode 101 and the lower electrode 71 in the first electrode part 75 will be referred to as a first pad electrode 101 and a first lower electrode 71, respectively. The pad electrode 102 and the lower electrode 81 in the second electrode part 85 will be referred to as a second pad electrode 102 and a second lower electrode 81, respectively.

Figure 30A:
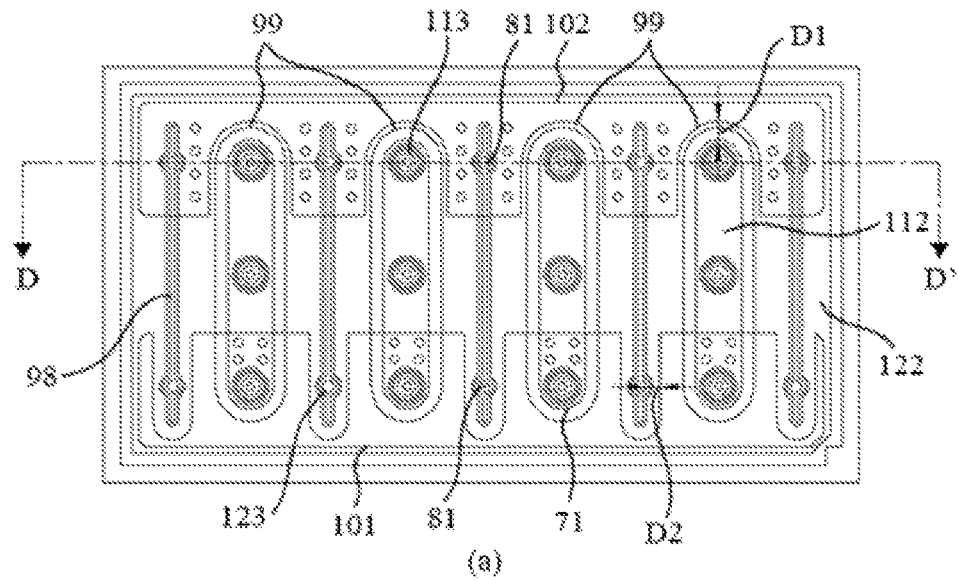
FIGS. 30(a) and 30(b) are views showing another exemplary embodiment of a semiconductor light emitting device in accordance with the present disclosure.

FIG. 30(a) is a view showing the semiconductor light emitting device of the disclosure when seen in a plan view.

The first electrode part 75 includes the first pad electrode 101, the first connection electrode 112, the first lower electrode 71, and the first lower electrical connection 113. The second electrode part 85 includes the second pad electrode 102, the second connection electrode 122, the second lower electrode 81, and the second lower electrical connection 123.

The first pad electrode 101 is formed on top of the insulating layer 95 and has a first conductivity. The first connection electrode 112 is formed between the non-conductive reflective film 91 and the insulating layer 95 and electrically connected to the first pad electrode 101. The first lower electrode 71 may be electrically connected to the first semiconductor layer 30 and come in contact with the first semiconductor layer 30. The first lower electrical connection 113 connects the first lower electrode 71 and the first connection electrode 112.

The second pad electrode 102 is formed on top of the insulating layer 95 and has a second conductivity. The second connection electrode 122 is formed between the non-conductive reflective film 91 and the insulating layer 95 and electrically connected to the second pad electrode 102. The second lower electrode 81 may be electrically connected to the second semiconductor layer 50 and come in contact with the second semiconductor layer 50. The second lower electrical connection 123 connects the second lower electrode 81 and the second connection electrode 122.

Referring again to the plan view, the first pad electrode 101 may be at least one of those that are formed separately away from the second lower electrical connection 123, and the second pad electrode 102 may be at least one of those that are formed separately away from the first lower electrical connection 113.

Referring further to the plan view, the first pad electrode 101 may be at least one of those that are formed separately away from the second connection electrode 122, and the second pad electrode 102 may be at least one of those that are formed separately away from the first connection electrode 112. The reasons for these will be described in more detail with reference to FIG. 32.

In the plan view, at least one of a distance D1 between the first pad electrode 101 and the second lower electrical connection 123 and a distance D2 between the second pad electrode 102 and the first lower electrical connection 113 may have a space. For example, in the plan view, at least one of the distance D1 between the first pad electrode 101 and the second lower electrical connection 123 and the distance D2 between the second pad electrode 102 and the first lower electrical connection 113 may have a space of 15 µm or greater as a margin requirement associated with the photoresist process. These distances D1 and D2 should be spaced apart to be able to produce insulating effects. In addition, at least one of the distance D1 between the first pad electrode 101 and the second lower electrical connection 123 and the distance D2 between the second pad electrode 102 and the first lower electrical connection 113 may remain constant. It is understood that electrostatic discharge and electrical overstress performances can be improved as at least one of the distance D1 between the first pad electrode 101 and the second lower electrical connection 123 and the distance D2 between the second pad electrode 102 and the first lower electrical connection 113 remains constant.

Figure 30B:
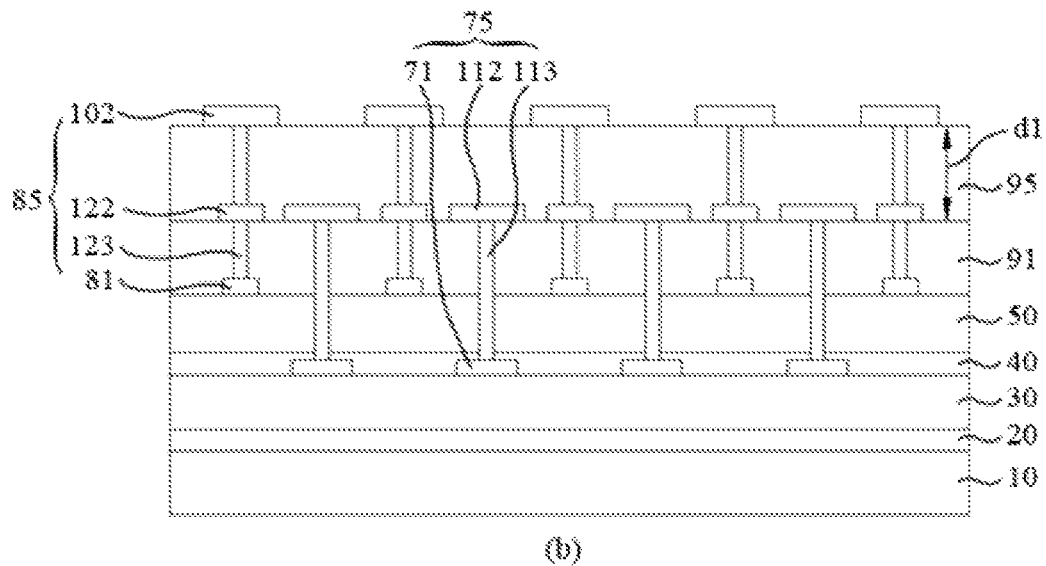

FIG. 30(b) is a cross-sectional view taken along line D-D' in FIG. 30(a).

As shown in FIG. 30(b), below the second pad electrode 102 having a second conductivity, none of the first lower electrical connection 113 and first connection electrode 112 having a first conductivity is present.

Figure 31:
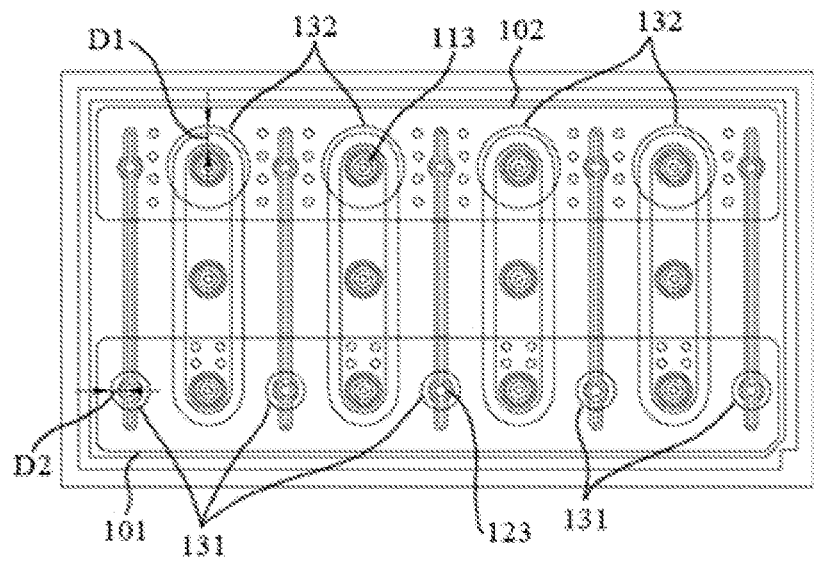
FIG. 31 is a view showing another exemplary embodiment of a semiconductor light emitting device in accordance with the present disclosure.

FIG. 31 is a view showing another exemplary embodiment of a semiconductor light emitting device in accordance with the present disclosure.

The first pad electrode 101 forms an opening 131 in which the second lower electrical connection 123 is provided. The second pad electrode 102 forms an opening 132 in which the first lower electrical connection 113 is provided.

At last one of the distance D2 between the first pad electrode 101 and the second lower electrical connection 123 provided in the opening 131 of the first pad electrode and the distance D1 between the second pad electrode 102 and the first lower electrical connection 113 provided in the opening 132 of the second pad electrode 102 may have a space. For example, at last one of the distance D2 between the first pad electrode 101 and the second lower electrical connection 123 provided in the opening 131 of the first pad electrode and the distance D1 between the second pad electrode 102 and the first lower electrical connection 113 provided in the opening 132 of the second pad electrode 102 may have a space of 15 μm or greater as a margin requirement associated with the photoresist process. In addition, the distance D2 between the first pad electrode 101 and the second lower electrical connection 123 and the distance D1 between the second pad electrode 102 and the first lower electrical connection 113 may remain constant. It is understood that electrostatic discharge and electrical overstress performances can be improved as the distance D2 between the first pad electrode 101 and the second lower electrical connection 123 and the distance D1 between the second pad electrode 102 and the first lower electrical connection 113 remain constant.

Figure 32:
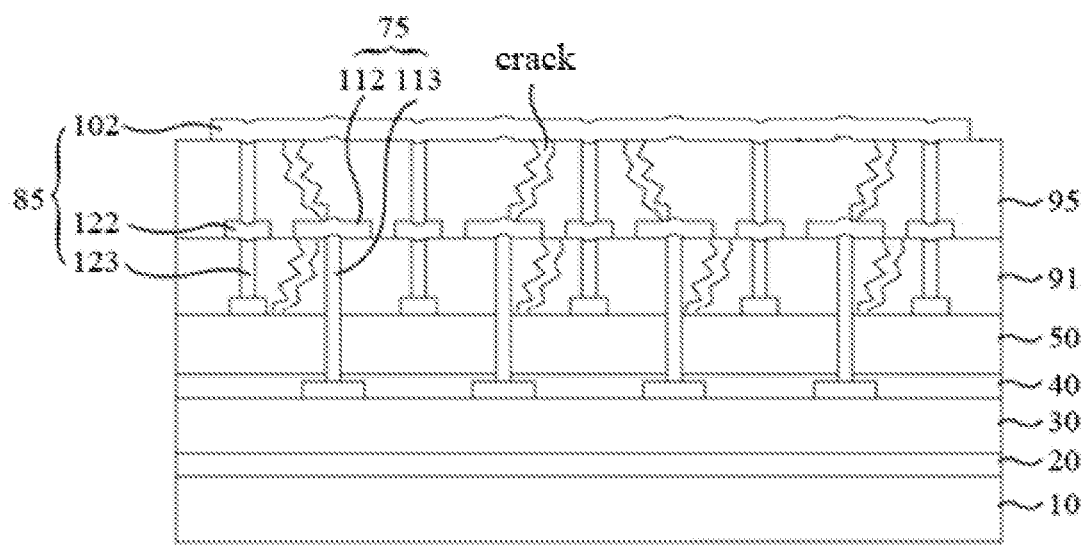
FIG. 32 is a cross-sectional view taken along line E-E' in FIG. 26.

FIG. 32 is a cross-sectional view taken along line E-E' in FIG. 26.

The first lower electrical connection 113 and the second lower electrical connection 123 may formed into bumps or depressions from the upper face of the non-conductive reflective film 91. If the first lower electrical connection 113 and the second lower electrical connection 123 is either depressed or bumped, the insulating layer 95 or the non-conductive reflective film 95 can be deposited in a distorted manner and cracks may occur in the insulating layer 95 or the non-conductive reflective film 91. In this case, a material of the second pad electrode 102 may intrude through the cracks, causing the first and second electrode parts 75 and 85 to be electrically connected and possibly shorted. Such a short between the first electrode part 75 and the second electrode part 85 occurs because the second pad electrode 102 gets closer to the first lower electrical connection 123. To avoid this, as shown in the plan view of FIG. 30(a), the first pad electrode 101 may be formed separately away from the second lower electrical connection 123, and the second pad electrode 102 may be formed separately away from the first lower electrical connection 113.

The following describes various exemplary embodiments of the present disclosure.

(1) A semiconductor light emitting device characterized by being a flip chip comprising: a plurality of semiconductor layers, which includes a first semiconductor layer having a first conductivity, a second semiconductor layer having a second conductivity different from the first conductivity type, and an active layer interpositioned between the first and second semiconductor layers and adapted to generate light by electron-hole recombination; an insulating layer, which is formed on the plurality of semiconductor layers and has openings; and an electrode formed on the insulating layer and electrically connected to the plurality of semiconductor layers through the opening, wherein the electrode has a top face and a bottom face, with the top face having a smaller area than the bottom face.

(2) The semiconductor light emitting device of (1), characterized in that the insulating layer is a non-conductive reflective layer made of a non-conductive reflective material for reflecting light generated by the active layer towards the plurality of semiconductor layers.

(3) The semiconductor light emitting device of (1), characterized in that the electrode is formed in the opening of the insulating layer.

(4) The semiconductor light emitting device of (1), characterized in that the electrode comprises a soldering layer.

(5) The semiconductor light emitting device of (1), characterized in that a lateral face connecting the top and bottom faces of the electrode is inclined.

(6) The semiconductor light emitting device of (1), characterized in that the lateral face has an angle of inclination of 70 degrees or less.

(7) The semiconductor light emitting device of (1), characterized in that the lateral face connecting the top and bottom faces of the electrode has a stair shape.

(8) The semiconductor light emitting device of (1) further comprising: an additional insulating layer, which is formed between the plurality of semiconductor layers and the insulating layer and has a plurality of openings; and a connection electrode formed between the insulating layer and the additional insulating layer, wherein the connection electrode is electrically connected to the plurality of semiconductor layers through the plurality of openings provided in the additional insulating layer, and the connection electrode is electrically connected to the electrode through the opening provided in the insulating layer.

(9) The semiconductor light emitting device of (1), characterized in that the additional insulating layer is a non-conductive reflective layer made of a non-conductive reflective material for reflecting light generated by the active layer towards the plurality of semiconductor layers.

(10) The semiconductor light emitting device of (1), characterized in that the insulating layer and the additional insulating layer are non-conductive reflective layers made of a non-conductive reflective material for reflecting light generated by the active layer towards the plurality of semiconductor layers.

(11) A semiconductor light emitting device characterized by comprising: a plurality of semiconductor layers, which includes a first semiconductor layer having a first conductivity, a second semiconductor layer having a second conductivity different from the first conductivity type, and an active layer interpositioned between the first and second semiconductor layers and adapted to generate light by electron-hole recombination; a non-conductive reflective film formed on the plurality of semiconductor layers to reflect the light generated by the active layer towards the first semiconductor layer; an insulating layer formed on the non-conductive reflective film; a first electrode part, which is electrically connected to the first semiconductor layer and supplies either electrons or holes to the first semiconductor layer; and a second electrode part, which is electrically connected to the second semiconductor layer and supplies, to the second semiconductor layer, the other of the holes or the electrons, wherein the first and second electrode parts formed on the insulating layer each have an upper electrode, with the insulating layer being flat in a central region between the upper electrodes.

(12) The semiconductor light emitting device of (11), characterized in that at least one of the first and second electrode parts comprises a finger electrode formed between the plurality of semiconductor layers and the non-conductive reflective film, and the finger electrode under the insulating layer in the central region is removed.

(13) The semiconductor light emitting device of (11), characterized in that at least one of the first and second electrode parts comprises a connection electrode formed between the non-conductive reflective film and the insulating layer, and the connection electrode formed under the insulating layer in the central region is broader than the central region.

(14) The semiconductor light emitting device of (11), characterized in that at least one of the first and second electrode parts comprises a connection electrode formed between the non-conductive reflective film and the insulating layer, and the connection electrode formed under the insulating layer in the central region is removed.

(15) The semiconductor light emitting device of (11), characterized in that the first and second electrode parts comprise connection electrodes, respectively, formed between the non-conductive reflective film and the insulating layer, wherein one of the connection electrodes of the first and second electrode parts forms a plurality of openings, and the other of the connection electrodes of the first and second electrode parts is provided in the plurality of openings.

(16) The semiconductor light emitting device of (11), characterized in that at least one of the first and second electrode parts comprises a finger electrode formed between the plurality of semiconductor layers and the non-conductive reflective film, and a connection electrode formed between the non-conductive reflective film and the insulating layer, wherein the finger and connection electrodes under the insulating layer in the central region are removed.

(17) The semiconductor light emitting device of (11), characterized in that the non-conductive reflective film comprises a DBR (Distributed Bragg Reflector).

(18) The semiconductor light emitting device of (11), characterized in that the insulating layer is formed of a dielectric.

(19) The semiconductor light emitting device of (11), characterized in that the central region has a diameter of 32 µm or greater.

(20) The semiconductor light emitting device of (11), characterized in that at least one of the first and second electrode parts comprises a finger electrode formed between the plurality of semiconductor layers and the non-conductive reflective film, and a connection electrode formed between the non-conductive reflective film and the insulating layer, wherein the finger electrode and the connection electrode are electrically connected through the plurality of openings.

(21) A semiconductor light emitting device characterized in comprising: a plurality of semiconductor layers, which includes a first semiconductor layer having a first conductivity, a second semiconductor layer having a second conductivity different from the first conductivity type, and an active layer interpositioned between the first and second semiconductor layers and adapted to generate light by electron-hole recombination; a non-conductive reflective film formed over the plurality of semiconductor layers to reflect the light generated by the active layer towards the first semiconductor layer; an insulating layer formed on the non-conductive reflective film; a first electrode part, which is electrically connected to the first semiconductor layer and supplies either electrons or holes to the first semiconductor layer; and a second electrode part, which is electrically connected to the second semiconductor layer and supplies, to the second semiconductor layer, the other of the holes or the electrons; wherein at least one of the first and second electrode parts includes a connection electrode formed between the non-conductive reflective film and the insulating layer, with the connection electrode covering over the non-conductive reflective film by at least 50% thereof.

The semiconductor light emitting device of (21), characterized in that the non-conductive reflective film comprises a DBR (Distributed Bragg Reflector).

The semiconductor light emitting device of (21), characterized in that the connection electrode covering over the non-conductive reflective film by at least 50% is electrically connected to one of the first and second electrode parts and forms a plurality of openings; and that a connection electrode electrically connected to the other of the first and second electrode parts is provided in the plurality of openings.

The semiconductor light emitting device of (21), characterized in that the insulating layer is formed of a dielectric.

The semiconductor light emitting device of (21), characterized in that the at least one of the first and second electrode parts comprises a finger electrode formed between the plurality of semiconductor layers and the non-conductive reflective film, and the finger electrode and the connection electrode are electrically connected.

The semiconductor light emitting device of (21), characterized in that the connection electrode covering over the non-conductive reflective film by at least 50% forms a plurality of openings.

The semiconductor light emitting device of (21), characterized in that the connection electrode is formed into a plurality of islands of which combined area covers over the non-conductive reflective film by at least 50%.

The semiconductor light emitting device of (21), characterized in that the connection electrode covering over the non-conductive reflective film by at least 50% is electrically connected to one of the first and second electrode parts and forms a plurality of islands; and that a connection electrode electrically connected to the other of the first and second electrode parts surrounds the plurality of islands.

The semiconductor light emitting device of (21), characterized in that the non-conductive reflective film and the insulating layer are dielectrics.

The semiconductor light emitting device of (21), characterized in that the non-conductive reflective film and the insulating layer are dielectrics; that the connection electrode covering over the non-conductive reflective film by at least 50% is electrically connected to one of the first and second electrode parts and forms a plurality of openings; and that a connection electrode electrically connected to the other of the first and second electrode parts is provided in the plurality of openings.

(31) A semiconductor light emitting device comprising: a plurality of semiconductor layers, which includes a first semiconductor layer having a first conductivity, a second semiconductor layer having a second conductivity different from the first conductivity type, and an active layer interpositioned between the first and second semiconductor layers and adapted to generate light by electron-hole recombination; a non-conductive reflective film formed on the plurality of semiconductor layers to reflect the light generated by the active layer towards the first semiconductor layer; an insulating layer formed on the non-conductive reflective film; a first electrode part, which is electrically connected to the first semiconductor layer and supplies either electrons or holes to the first semiconductor layer; and a second electrode part, which is electrically connected to the second semiconductor layer and supplies, to the second semiconductor layer, the other of the holes or the electrons, wherein the first electrode part includes a first pad electrode provided on top of the insulating layer, a first connection electrode formed between the non-conductive reflective film and the insulating layer, and a first lower electrode connected to the first semiconductor layer, a first lower electrical connection connecting the first lower electrode and the first connection electrode; and the second electrode part includes a second pad electrode provided on top of the insulating layer, a second connection electrode formed between the non-conductive reflective film and the insulating layer, a second lower electrode connected to the second semiconductor layer, and a second lower electrical connection connecting the second lower electrode and the second connection electrode, with the first pad electrode being at least one of those formed separately away from the second lower electrical connection and the second pad electrode being at least one of those formed separately away from the first lower electrical connection as seen in a plan view.

(32) The semiconductor light emitting device of (31), characterized in that the first pad electrode forms an opening, the second lower electrical connection is provided in the opening of the first pad electrode, the second pad electrode forms an opening, and the first lower electrical connection is provided in the opening of the second pad electrode.

(33) The semiconductor light emitting device of (31), characterized in that the first pad electrode is at least one of those that are formed separately away from the second connection electrode, and the second pad electrode is at least one of those that are formed separately away from the first connection electrode.

(34) The semiconductor light emitting device of (31), characterized in that, as seen in the plan view, at least one of a distance between the first pad electrode and the second lower electrical connection and a distance between the second pad electrode and the first lower electrical connection is 15 μm or greater.

(35) The semiconductor light emitting device of (31), characterized in that the distance between the first pad electrode and the second lower electrical connection and the distance between the second pad electrode and the first lower electrical connection remain constant.

(36) The semiconductor light emitting device of (31), characterized in that, as seen in the plan view, at least one of a distance from the opening of the first pad electrode to the second lower electrical connection and a distance from the second pad electrode to the first lower electrical connection is 15 μm or greater.

(37) The semiconductor light emitting device of (31), characterized in that the distance from the opening of the first pad electrode to the second lower electrical connection and the distance from the second pad electrode to the first lower electrical connection remain constant.

The semiconductor light emitting device in accordance with the present disclosure has the structure for preventing at least one of shorts between the first pad electrode and the second lower electrical connection and between the second pad electrode and the first lower electrical connection.

The semiconductor light emitting device in accordance with the present disclosure is adapted to efficiently reflect light.

The semiconductor light emitting device in accordance with the present disclosure is adapted to efficiently reflect light even when the insulating layer is present on the non-conductive reflective film.

The semiconductor light emitting device in accordance with the present disclosure includes the connection electrodes for reflecting light that has transmitted through the non-conductive reflective film towards to the semiconductor layers such that the efficiency of light emission can be enhanced.

The semiconductor light emitting device in accordance with the present disclosure is adapted to maintain its performance even when exposed to a shock.

The semiconductor light emitting device in accordance with the present disclosure is not damaged by a shock.

The semiconductor light emitting device in accordance with the present disclosure has the central region where the insulating layer or the non-conductive reflective film are not damaged by a shock.

The semiconductor light emitting device in accordance with the present disclosure has the connection electrode adapted to cover over the non-conductive reflective film such that a shock can be absorbed by the connection electrode.

The semiconductor light emitting device in accordance with the present disclosure is adapted to solve a cracking problem that may occur in the insulating layer located under the electrodes of the semiconductor light emitting device as it is electrically connected to an external substrate by soldering.

What is claimed is:

1. A semiconductor light emitting device comprising:
a plurality of semiconductor layers, which includes a first semiconductor layer having a first conductivity, a second semiconductor layer having a second conductivity different from the first conductivity type, and an active layer interpositioned between the first and second semiconductor layers and adapted to generate light by electron-hole recombination;
a non-conductive reflective film formed over the plurality of semiconductor layers to reflect the light generated by the active layer towards the first semiconductor layer;
an insulating layer formed on the non-conductive reflective film;
a first electrode part, which is electrically connected to the first semiconductor layer; and
a second electrode part, which is electrically connected to the second semiconductor layer;
wherein the active layer is provided on the first semiconductor layer and the second semiconductor layer is provided on the active layer;
wherein the first electrode part includes a first lower electrode formed under the non-conductive reflective film and electrically connected to the first semiconductor layer, one or more first connection electrodes formed between the non-conductive reflective film and the insulating layer, and a first bonding pad formed on the insulating layer;
wherein the second electrode part includes a second lower electrode formed under the non-conductive reflective film and electrically connected to the second semiconductor layer, one or more second connection electrodes formed between the non-conductive reflective film and the insulating layer, and a second bonding pad formed on the insulating layer;
wherein the one or more first connection electrodes and the one or more second connection electrodes are in contact with the non-conductive reflective film;

wherein the non-conductive reflective film comprises a DBR (Distributed Bragg Reflector);
wherein the insulating layer is formed of a dielectric;
wherein the one or more first connection electrodes are extended through the non-conductive reflective film for electrical connection to the first lower electrode;
wherein the one or more second connection electrodes are extended through the non-conductive reflective film for electrical connection to the second lower electrode;
wherein the one or more first connection electrodes include a reflective metal;
wherein the one or more second connection electrodes include a reflective metal; and
wherein the non-conductive reflective film is covered and in contact with one of the one or more first connection electrodes and the one or more second connection electrodes by at least 50% as shown in a plane view.

2. The semiconductor light emitting device according to claim 1, wherein the non-conductive reflective film is covered and in contact with the one or more second connection electrodes by at least 50% as shown in a plane view.

3. The semiconductor light emitting device of according to claim 1, wherein the at least one of the first and second electrode parts comprises a finger electrode formed between the plurality of semiconductor layers and the non-conductive reflective film, and the finger electrode and one of the one or more first connection electrodes and the one or more second connection electrodes are electrically connected.

4. The semiconductor light emitting device according to claim 2,
wherein the one or more second connection electrodes are comprised of a single second connection electrode;
wherein the single second connection electrode is provided with a plurality of openings; and
wherein the plurality of islands are provided in the plurality of openings, respectively.

5. The semiconductor light emitting device according to claim 1,
wherein one of the one or more first connection electrodes and the one or more second connection electrodes is comprised of a plurality of islands;
wherein the other of the one or more first connection electrodes and the one or more second connection electrodes is comprised of a single connection electrode including a plurality of openings; and
wherein the plurality of islands are provided in the plurality of openings, respectively.

6. The semiconductor light emitting device according to claim 5, wherein the non-conductive reflective film is covered with the plurality of islands by at least 50% as shown in a plane view.

7. The semiconductor light emitting device according to claim 6, wherein the one or more first connection electrodes are comprised of the plurality of islands.

* * * * *